United States Patent
Vadhavkar et al.

(10) Patent No.: US 9,443,744 B2
(45) Date of Patent: Sep. 13, 2016

(54) STACKED SEMICONDUCTOR DIE ASSEMBLIES WITH HIGH EFFICIENCY THERMAL PATHS AND ASSOCIATED METHODS

(71) Applicant: Micron Technology, Inc., Boise, ID (US)

(72) Inventors: Sameer S. Vadhavkar, Boise, ID (US); Xiao Li, Boise, ID (US); Steven K. Groothuis, Boise, ID (US); Jian Li, Boise, ID (US); Jaspreet S. Gandhi, Boise, ID (US); James M. Derderian, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 14/330,934

(22) Filed: Jul. 14, 2014

(65) Prior Publication Data

US 2016/0013115 A1  Jan. 14, 2016

(51) Int. Cl.
*H01L 23/48* (2006.01)
*H01L 23/52* (2006.01)
*H01L 29/40* (2006.01)
*H01L 21/56* (2006.01)
(Continued)

(52) U.S. Cl.
CPC ......... *H01L 21/563* (2013.01); *H01L 21/4882* (2013.01); *H01L 21/50* (2013.01); *H01L 23/04* (2013.01); *H01L 23/36* (2013.01); *H01L 23/3675* (2013.01); *H01L 25/0657* (2013.01); *H01L 25/16* (2013.01); *H01L 25/167* (2013.01); *H01L 25/50* (2013.01); *H01L 2224/16145* (2013.01)

(58) Field of Classification Search
CPC . H01L 23/34; H01L 25/167; H01L 23/3107; H01L 25/0657; H01L 21/563; H01L 25/16; H01L 25/50
See application file for complete search history.

(56) References Cited

U.S. PATENT DOCUMENTS 4,323,914 A   4/1982   Berndlmaier et al.
5,001,548 A   3/1991   Iversen
(Continued)

FOREIGN PATENT DOCUMENTS

KR   1020090083779 A   8/2009

OTHER PUBLICATIONS

International Search Report and Written Opinion mailed Oct. 28, 2015 in PCT/US2015/037685, 15 pages.
(Continued)

*Primary Examiner* — Victor A Mandala
(74) *Attorney, Agent, or Firm* — Perkins Coie LLP

(57) ABSTRACT

A semiconductor die assembly having high efficiency thermal paths. In one embodiment, the semiconductor die assembly comprises a package support substrate, a first semiconductor die having a peripheral region and a stacking region, and a second semiconductor die attached to the stacking region of the first die such that the peripheral region is lateral of the second die. The assembly further includes a thermal transfer unit having a base attached to the peripheral region of the first die, a cover attached to the base by an adhesive, and a cavity defined by at least cover, wherein the second die is within the cavity. The assembly also includes an underfill in the cavity, wherein a fillet portion of the underfill extends a distance up along a portion of the footing and upward along at least a portion of the base.

26 Claims, 20 Drawing Sheets

(51) Int. Cl.
*H01L 25/065* (2006.01)
*H01L 25/16* (2006.01)
*H01L 25/00* (2006.01)
*H01L 23/04* (2006.01)
*H01L 21/50* (2006.01)
*H01L 23/36* (2006.01)
*H01L 23/367* (2006.01)
*H01L 21/48* (2006.01)

(56) References Cited

U.S. PATENT DOCUMENTS

| | | | |
|---|---|---|---|
| 5,405,808 A | 4/1995 | Schneider et al. | |
| 6,091,142 A | 7/2000 | Lee | |
| 6,686,654 B2 | 2/2004 | Farrar et al. | |
| 6,717,812 B1* | 4/2004 | Pinjala | H01L 23/473 165/80.4 |
| 7,592,697 B2 | 9/2009 | Arana et al. | |
| 2005/0218508 A1 | 10/2005 | Fitzgerald et al. | |
| 2005/0224953 A1 | 10/2005 | Lee et al. | |
| 2007/0126103 A1 | 6/2007 | Shi | |
| 2009/0057881 A1* | 3/2009 | Arana | H01L 23/473 257/714 |
| 2010/0117209 A1 | 5/2010 | Bezama et al. | |
| 2011/0147916 A1* | 6/2011 | Su | H01L 21/54 257/692 |
| 2011/0244628 A1* | 10/2011 | Ode | H01L 21/565 438/109 |
| 2012/0063090 A1* | 3/2012 | Hsiao | H01L 23/44 361/699 |
| 2012/0187568 A1* | 7/2012 | Lin | H01L 21/76898 257/774 |
| 2013/0016477 A1 | 1/2013 | Yokoya et al. | |
| 2013/0119528 A1* | 5/2013 | Groothuis | H01L 23/36 257/690 |
| 2015/0170991 A1* | 6/2015 | Li | H01L 25/0657 257/777 |

OTHER PUBLICATIONS

Choi, M. et al., "Liquid Cooling for a Multichip Module using Fluorinert Liquid and Parrafin Slurry," International Journal of Heat and Mass Transfer, 43 (2000) abstract only, DOI: 10.1016/S0017-9310(99)00137-4.

Khan, N. et al., "3D Packaging with Through Silicon Via (TSV) for Electrical and Fluidic Interconnections," 2009 Electronic Components and Technology Conference, May 2009, pp. 1153-1158, DOI: 10.1109/ECTC.2009.5074157.

Shi, B. et al., "Liquid Cooling for 3D-ICs," 2011 International Green Computing Conference and Workshops, Jul. 2011, 6 pages, DOI: 10.1109/IGCC.2011.6008576.

Tang, G.Y. et al., "Integrated Liquid Cooling Systems for 3-D Stacked TSV Modules," IEEE Transactions on Components and Packaging Technologies, vol. 33, No. 1, pp. 184-195, Mar. 2010, DOI: 10.1109/TCAPT.2009.2033039.

* cited by examiner

US 9,443,744 B2

STACKED SEMICONDUCTOR DIE ASSEMBLIES WITH HIGH EFFICIENCY THERMAL PATHS AND ASSOCIATED METHODS

TECHNICAL FIELD

The disclosed embodiments relate to semiconductor die assemblies. In particular, the present technology relates to stacked semiconductor die assemblies with highly efficient thermal paths and associated systems and methods.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Market pressures continually drive semiconductor manufacturers to reduce the size of die packages to fit within the space constraints of electronic devices, while also pressuring them to increase the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

A challenge associated with vertically-stacked die packages is that the heat from the individual dies is additive and it is difficult to dissipate the aggregated heat generated by the stacked die. This increases the operating temperatures of the individual dies, the junctions between the dies, and the package as a whole, which can cause the stacked dies to reach temperatures above their maximum operating temperatures (Tmax). The problem is also exacerbated as the density of the dies in the package increases. Moreover, when devices have different types of dies in the die stack, the maximum operating temperature of the device is limited to the die with the lowest maximum operating temperature.

DETAILED DESCRIPTION

Specific details of several embodiments of stacked semiconductor die assemblies with highly efficient thermal paths and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat via, for example, conduction, convection and/or radiation. A person skilled in the relevant art will also understand that the technology may have additional embodiments, and that the technology may be practiced without several of the details of the embodiments described below with reference to FIGS. 1-10

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1:
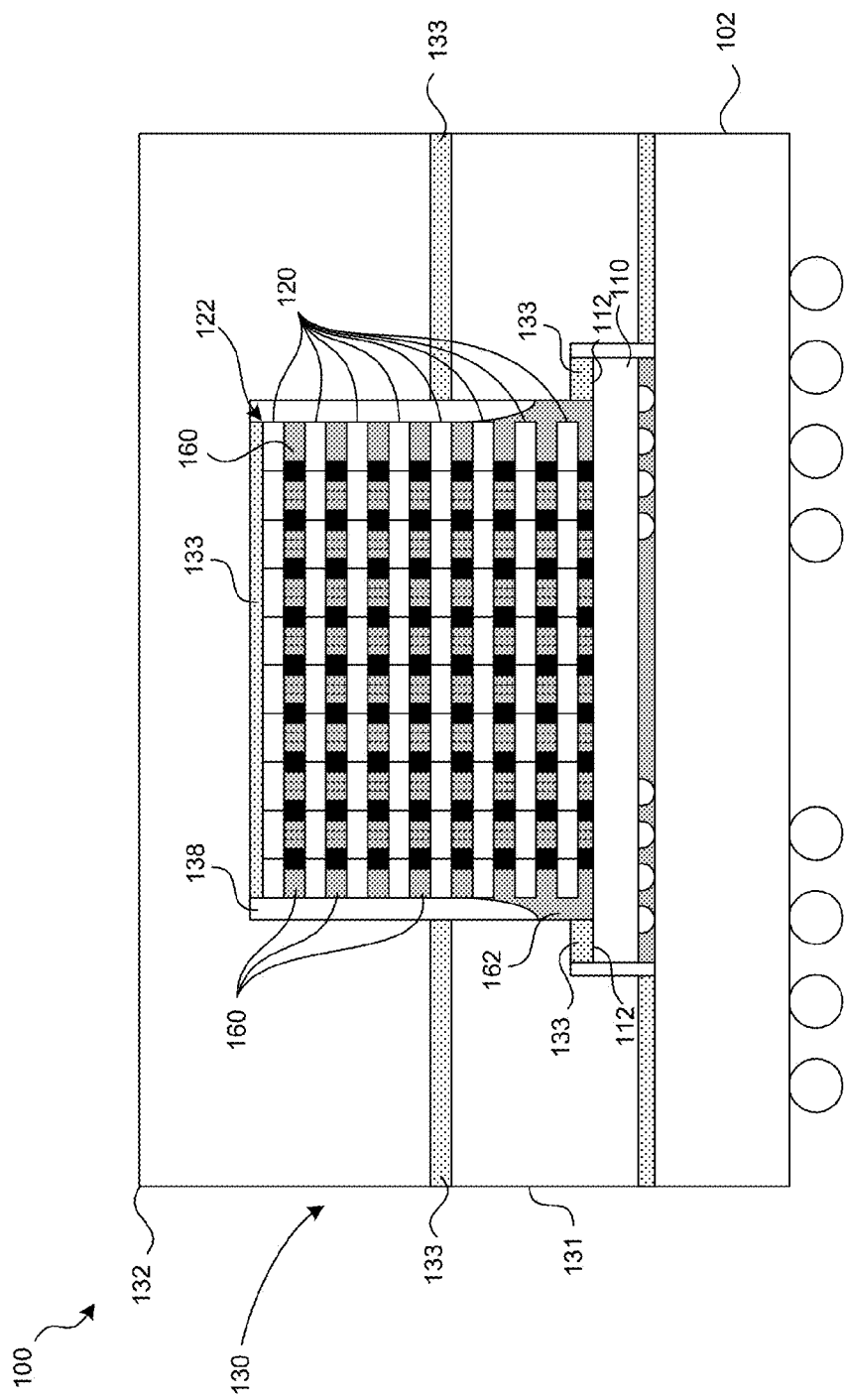
FIG. 1 is a cross-sectional view illustrating a semiconductor die assembly in accordance with embodiments of the present technology.

FIG. 1 is a cross-sectional view illustrating a semiconductor die assembly 100 ("assembly 100") in accordance with an embodiment of the present technology. The assembly 100 can include a package support substrate 102, a first semiconductor die 110 mounted to the package support substrate 102, and a plurality of second semiconductor dies 120 arranged in a stack 122 at a stacking area, such as a central region or an off-center region, of the first die 110. The first die 110 can further include a peripheral region 112 laterally outboard of the second dies 120 and a thermal transfer structure (TTS) 130 having a first portion 131 attached to the peripheral region 112 of the first die 110 by an adhesive 133 and a second portion 132 covering, enclosing or otherwise over the stack 122 of second dies 120. The adhesive 133, for example, can be a thermal interface material ("TIM") or another suitable adhesive. For example, TIMs and other adhesives can include silicone-based greases, gels, or adhesives that are doped with conductive materials (e.g., carbon nano-tubes, solder materials, diamond-like carbon (DLC), etc.), as well as phase-change materials. In the embodiment illustrated in FIG. 1, the first portion 131 is a base, such as a dam member, that extends at least from the peripheral region 112 of the first die 110 to a height at an intermediate elevation of the stack 122 of second dies 120. The second portion 132 is a cover that is attached to the first portion 131 and the uppermost second die 120 by the adhesive 133. The first portion 131 and second portion 132 together can define a casing made from a metal (e.g., copper or aluminum) or other highly thermally conductive materials, and the first and second portions 131 and 132 together can define a cavity 138 in which the stack 122 of second dies 120 are positioned.

The assembly 100 further includes an underfill material 160 between each of the second dies 120 and between the first die 110 and the bottom second die 120. The underfill material 160 can form a fillet 162 that extends outwardly from the stack 122 of second dies 120 in a region proximate the first die 110. The assembly 100 is expected to provide enhanced thermal dissipation of heat from the first die 110 and the stack 122 of second dies 120. For example, the TTS 130 can be made from a material with a high thermal conductivity to efficiently transfer heat along a first path directly from a large portion of the peripheral region 112 of the first die 110 and along a second path through the second dies 120. The first portion 131 of the TTS 130 is attached to a large percentage of the available area of the peripheral region 112 of the first die 110 because the first portion 131 provides a dam that prevents the fillet 162 of underfill material 160 from covering a significant percentage of the peripheral region 112. This enhances the efficiency of the first heat path because, compared to devices where the underfill material is deposited before the first portion 131 is attached to the peripheral region 112 of the first die 110, more surface area of the peripheral region 112 can be covered by the first portion 131 of the TTS 130.

Several embodiments of the assembly 100 shown in FIG. 1 can accordingly provide enhanced thermal properties that lower the operating temperatures of the individual dies 110, 120 in the assembly 100 such that they stay below their designated maximum temperatures (Tmax). This can be very useful when the assembly 100 is arranged as a hybrid memory cube (HMC) because the first die 110 is generally a larger underlying logic die and the second dies 120 are generally memory dies, and logic dies typically operate at a much higher power level than memory dies (e.g., 5.24 W compared to 0.628 W). The logic die HMC configuration generally concentrates a significant amount of heat at the peripheral region 112 of the first die 110. The logic die may also have a higher power density at the peripheral region, resulting in a further concentration of heat and higher temperatures at the peripheral region. As such, by coupling a large percentage of the peripheral region 112 of the first die 110 to the highly conductive first portion 131 of the TTS 130, the heat can be efficiently removed from the peripheral region 112 of the first die.

Figure 2A:
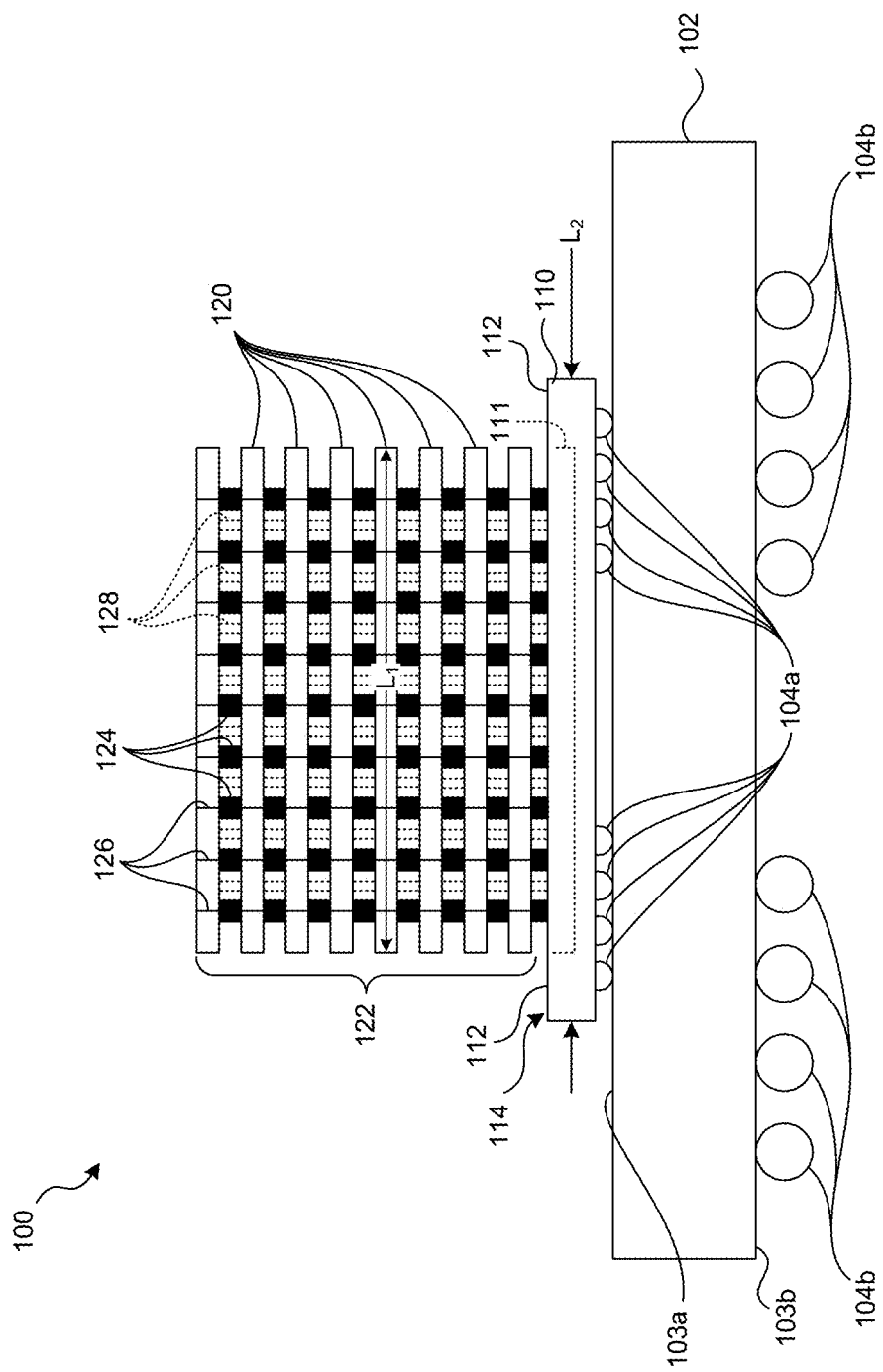
FIG. 2A is a cross-sectional view and FIG. 2B is a top plan view illustrating a method of manufacturing a semiconductor die assembly in accordance with embodiments of the technology.
Figure 2B:
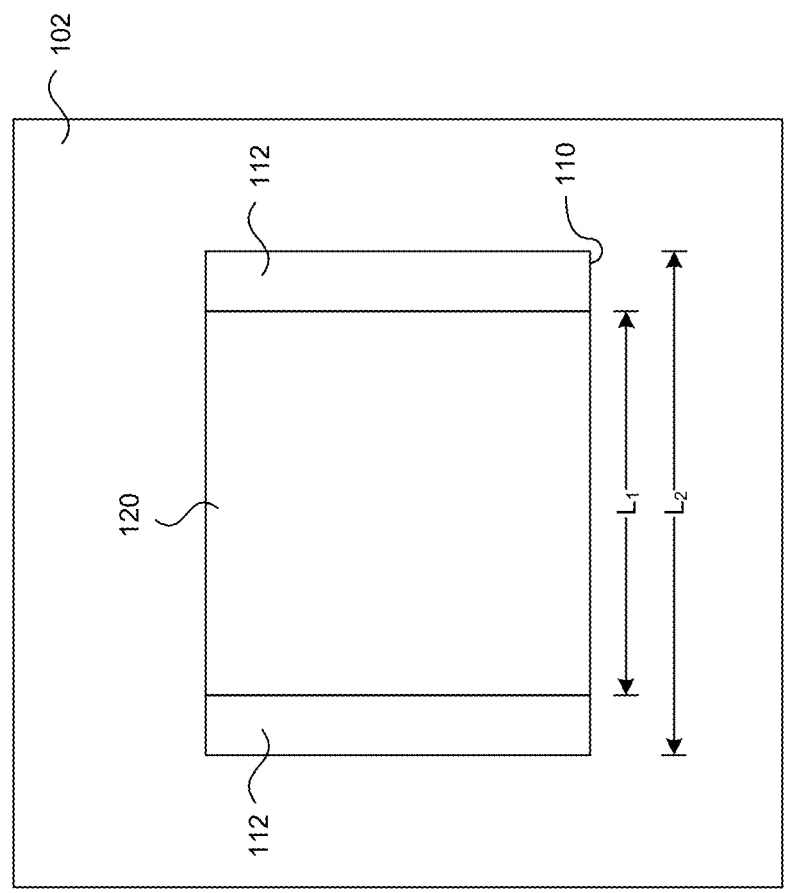

FIGS. 2A-2F illustrate aspects of a method of manufacturing the assembly 100 in accordance with embodiments of the present technology. FIG. 2A is a cross-sectional view and FIG. 2B is a top plan view of a stage of manufacturing the assembly 100. Referring to FIG. 2A, the package support substrate 102 is configured to connect the first and second dies 110, 120 to external electrical components of higher-level packaging (not shown). For example, the package support substrate 102 can be an interposer or printed circuit board that includes semiconductor components (e.g., doped silicon wafers or gallium arsenide wafers), non-conductive components (e.g., various ceramic substrates, such as aluminum oxide (Al2O3), aluminum nitride (AlN), etc.), and/or conductive portions (e.g., interconnecting circuitry, TSVs, etc.). In the embodiment illustrated in FIG. 2A, the package support substrate 102 is electrically coupled to the first die 110 at a first side 103a of the package support substrate 102 via a first plurality of electrical connectors 104a and to external circuitry (not shown) at a second side 103b of the package support substrate 102 via a second plurality of electrical connectors 104b (collectively referred to as "the electrical connectors 104"). The electrical connectors 104 can be solder balls, conductive bumps and pillars, conductive epoxies, and/or other suitable electrically conductive elements. In various embodiments, the package support substrate 102 can be made from a material with a relatively high thermal conductivity to enhance heat dissipation at the back side of the first semiconductor die 110.

As shown in FIGS. 2A and 2B, the first die 110 can have a larger footprint than the stacked second dies 120. The first die 110, therefore, includes a mounting region 111 (FIG. 2A) or stacking area where the second dies 120 are attached to the first die 110 and the peripheral region 112 extends laterally outward beyond at least one side of the mounting region 111. The peripheral region 112 is accordingly outboard of the second dies 120 (e.g., beyond the length and/or width of the second dies 120).

The first and second dies 110, 120 can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as an HMC in which the stacked second dies 120 are DRAM dies or other memory dies that provide data storage and the first die 110 is a high-speed logic die that provides memory control (e.g., DRAM control) within the HMC. In other embodiments, the first and second dies 110 and 120 may include other semiconductor components and/or the semiconductor components of the individual second dies 120 in the stack 122 may differ.

The first and second dies 110, 120 can be rectangular, circular, and/or other suitable shapes and may have various different dimensions. For example, the individual second dies 120 can each have a length L1 of about 10-11 mm (e.g., 10.7 mm) and a width of about 8-9 mm (e.g., 8.6 mm, 8.7 mm). The first die 110 can have a length L2 of about 12-13 mm (e.g., 12.67 mm) and a width of about 8-9 mm (e.g., 8.5 mm, 8.6 mm, etc.). In other embodiments, the first and second dies 110 and 120 can have other suitable dimensions and/or the individual second dies 120 may have different dimensions from one another.

The peripheral region 112 (known to those skilled in the art as a "porch" or "shelf") of the first die 110 can be defined by the relative dimensions of the first and second dies 110 and 120 and the position of the stack 122 on a forward-facing surface 114 of the first die 110. In the embodiment illustrated in FIGS. 2A and 2B, the stack 122 is centered with respect to the length L2 of the first die 110 such that the peripheral region 112 extends laterally beyond two opposite sides of the stack 122. For example, if the length L2 of the first die 110 is about 1.0 mm greater than the length L1 of the second dies 120, the peripheral region 112 will extend about 0.5 mm beyond either side of the centered second dies 120. The stack 122 may also be centered with respect to the width of the first die 110 and, in embodiments where both the width and length of the first die 110 are greater than those of the centered stack 122, the peripheral region 112 may extend around the entire perimeter of the second dies 120. In other embodiments, the stack 122 may be offset with respect to the forward-facing surface 114 (FIG. 2A) of the first die 110 and/or the peripheral region 112 of the first die 110 may extend around less than the full perimeter of the stack 122. In further embodiments, the first and second dies 110 and 120 can be circular, and therefore the relative diameters of the first and second dies 110 and 120 define the peripheral region 112.

As shown in FIG. 2A, the second dies 120 can be electrically coupled to one another in the stack 122 and to the underlying first die 110 by a plurality of electrically conductive elements 124 positioned between adjacent dies 110, 120. Although the stack 122 shown in FIG. 1 includes eight second dies 120 electrically coupled together, in other embodiments the stack 122 can include more or less than eight dies (e.g., 2-4 dies, or at least 9 dies etc.). The electrically conductive elements 124 can have various suitable structures, such as pillars, columns, studs, bumps, and can be made from copper, nickel, solder (e.g., SnAg-based solder), conductor-filled epoxy, and/or other electrically conductive materials. In selected embodiments, for example, the electrically conductive elements 124 can be copper pillars, whereas in other embodiments the electrically conductive elements 124 can include more complex structures, such as bump-on-nitride structures.

As further shown in FIG. 2A, the individual second dies 120 can each include a plurality of TSVs 126 aligned on one or both sides with corresponding electrically conductive elements 124 to provide electrical connections at opposing sides of the second dies 120. Each TSV 126 can include an electrically conductive material (e.g., copper) that passes completely through the individual second dies 120 and an electrically insulative material surrounding the electrically conductive material to electrically isolate the TSVs 126 from the remainder of the second dies 120. Though not shown in FIG. 1, the first die 110 can also include a plurality of TSVs 126 to electrically couple the first die 110 to higher level circuitry. Beyond electrical communication, the TSVs 126 and the electrically conductive elements 124 provide thermal conduits through which heat can be transferred away from the first and second dies 110 and 120 (e.g., through the first thermal path). In some embodiments, the dimensions of the electrically conductive elements 124 and/or the TSVs 126 can be increased to enhance heat transfer vertically through the stack 122. For example, the individual electrically conductive elements 124 can each have a diameter of about 15-30 μm or other suitable dimensions to enhance the thermal pathway through the dies 110, 120. In other embodiments, the second dies 120 can be electrically coupled to one another and to the first die 110 using other types of electrical connectors (e.g., wirebonds) that may also provide thermal pathways through the stack 122.

In various embodiments, the assembly 100 may also include a plurality of thermally conductive elements 128 (shown in broken lines) positioned interstitially between the electrically conductive elements 124. The individual thermally conductive elements 128 can be at least generally similar in structure and composition as that of the electrically conductive elements 124 (e.g., copper pillars). However, the thermally conductive elements 128 are not electrically coupled to the TSVs 126 or other electrically active components of the dies 110 and 120, and therefore do not provide electrical connections between the second dies 120. Instead, the thermally conductive elements 128 are electrically isolated "dumb elements" that increase the overall thermal conductivity through the stack 122 to enhance the heat transfer along a first thermal path. For example, in embodiments where the assembly 100 is configured as a HMC, the addition of the thermally conductive elements 128 between the electrically conductive elements 124 has been shown to decrease the operating temperature of the HMC by several degrees (e.g., about 6-7° C.).

Figure 2C:
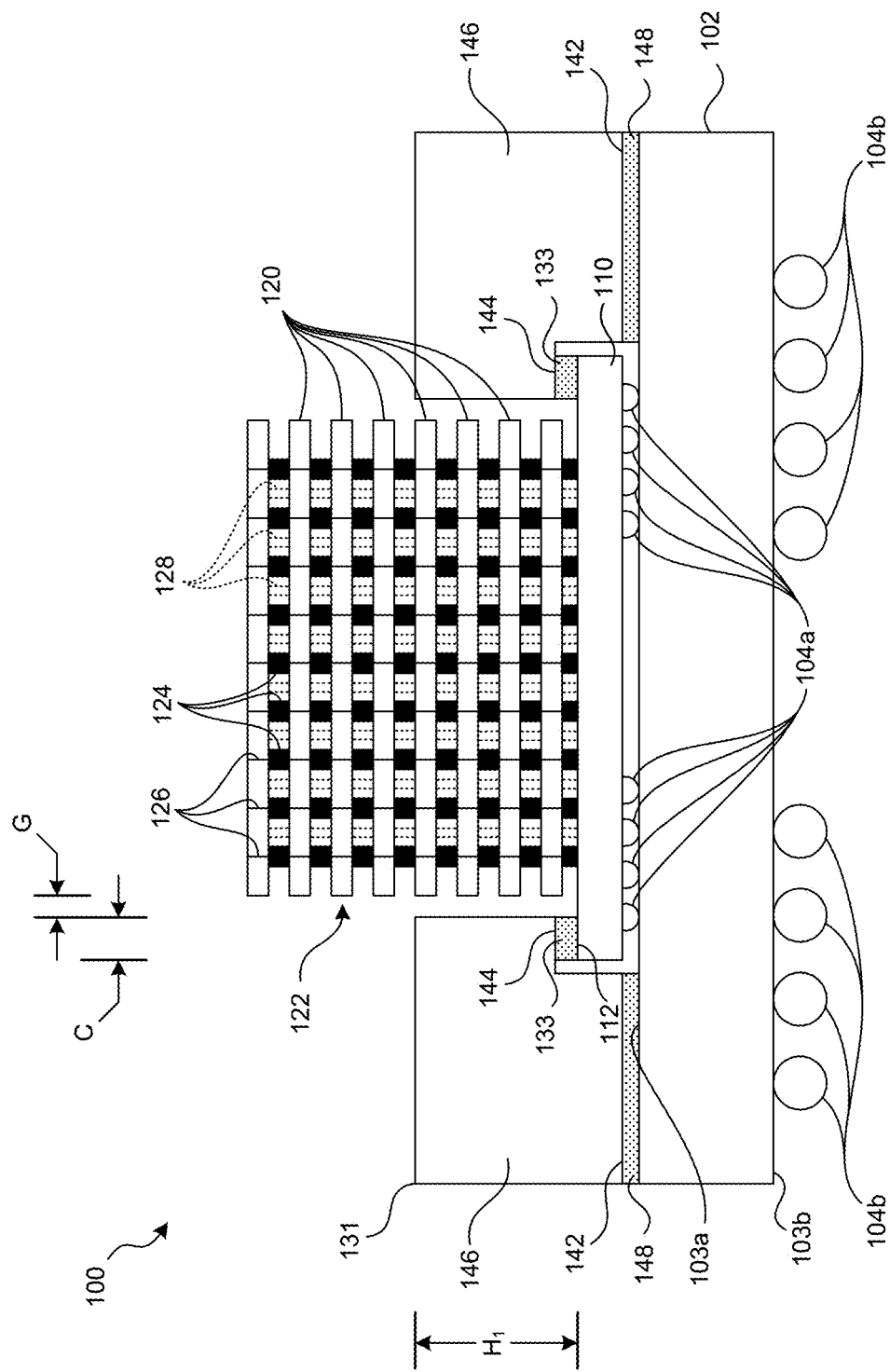
FIG. 2C is a cross-sectional view and FIG. 2D is a top plan view illustrating a method of manufacturing a semiconductor die assembly in accordance with embodiments of the technology.
Figure 2D:
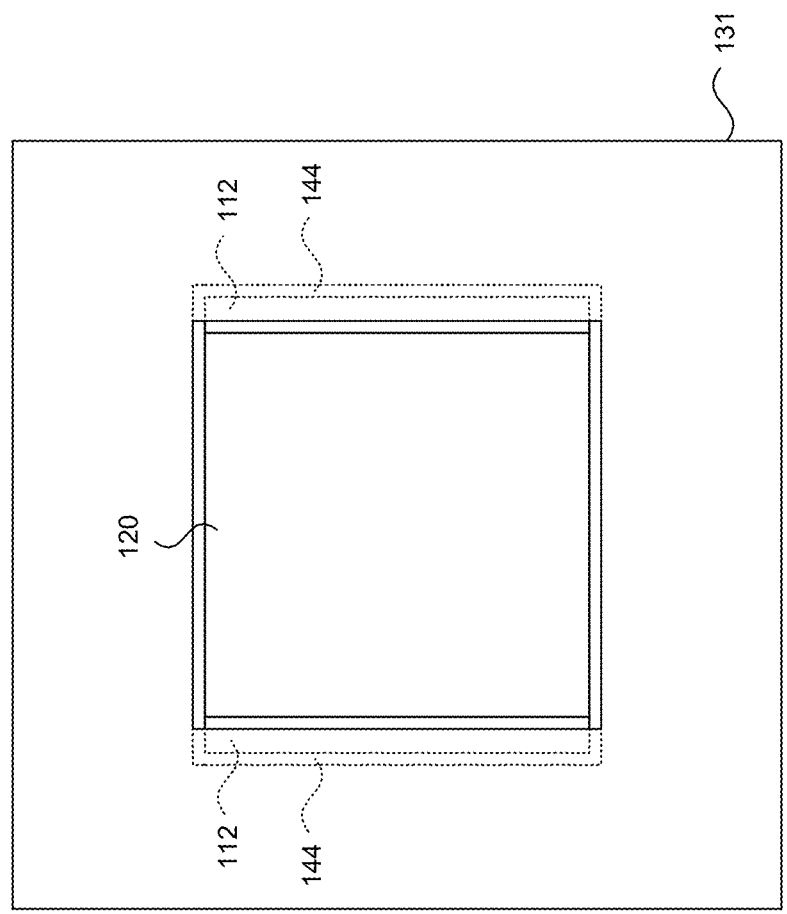

FIG. 2C is a cross-sectional view and FIG. 2D is a top plan view illustrating a subsequent stage of a method for manufacturing the assembly 100 after the first portion 131 of the TTS 130 (FIG. 1) has been attached to the first die 110 and the package support substrate 102. Referring to FIG. 2C, this embodiment of the first portion 131 has a foundation 142 (e.g., footing) configured to extend around at least a portion of the first die 110 and a shoulder 144 configured to be positioned over the peripheral region 112 of the first die 110. The first portion 131 can further include a sidewall 146 that extends to a height (H1) relative to the stack 122 of second dies 120. The sidewall 146 is also spaced apart from the stack 122 of second dies 120 by a gap (G) such that the shoulder 144 covers a significant percentage of the peripheral region 112 (e.g., coverage area (C)). The foundation 142 can be attached to the package support substrate 102 by an adhesive 148, and the shoulder 144 can be attached to the peripheral region 112 of the first die 110 by the thermally conductive adhesive 133. The adhesives 133 and 148 can be the same adhesive, or they can be different from each other. The adhesive 133, for example, can be a TIM. As shown in FIG. 2D, the first portion 131 can be a ring that surrounds the first die 110 and the second dies 120.

Figure 2E:
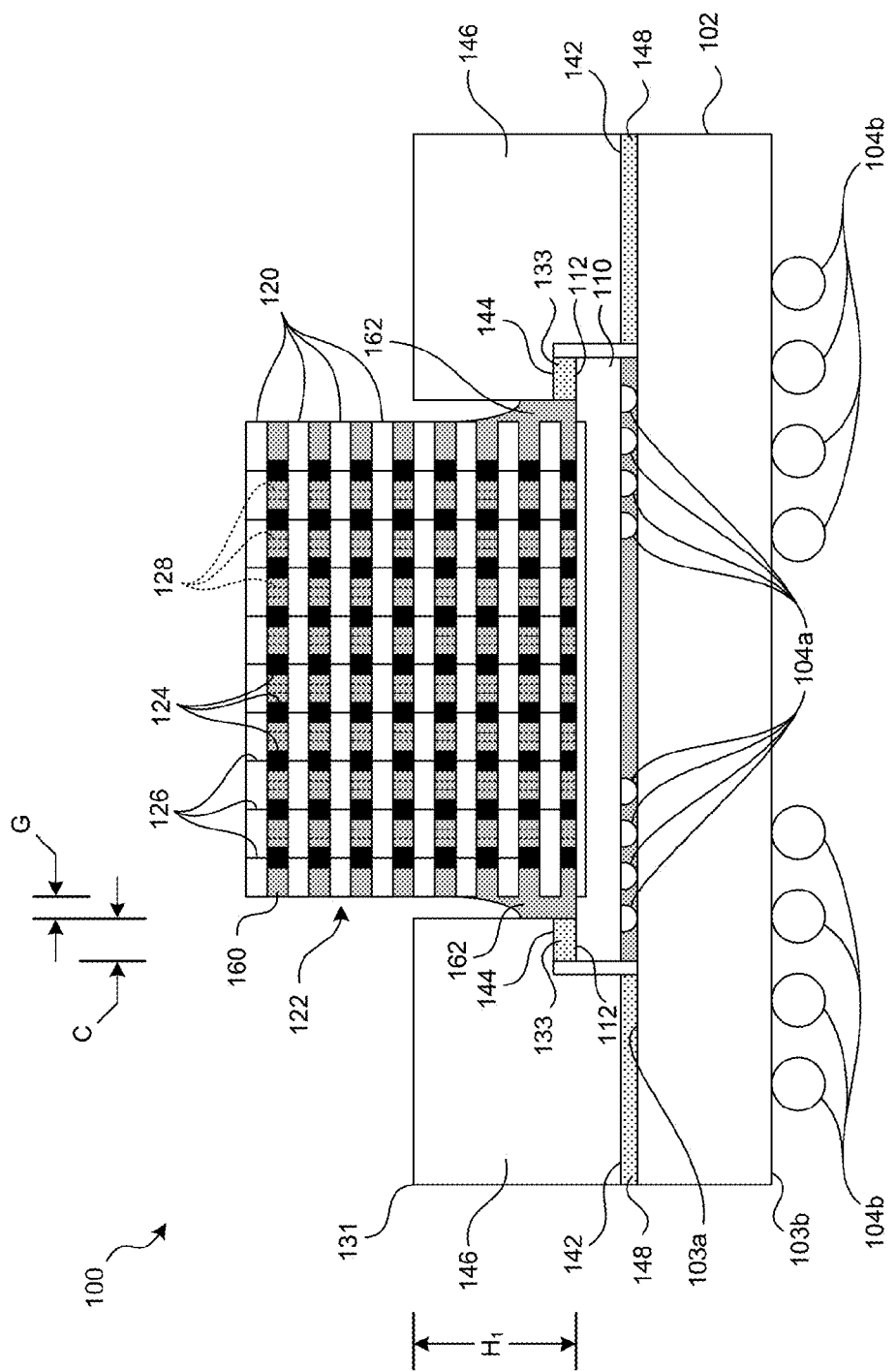
FIGS. 2E and 2F are cross-sectional views illustrating a method of manufacturing a semiconductor die assembly in accordance with embodiments of the technology.

FIG. 2E is a cross-sectional view illustrating another stage of the method of manufacturing the assembly 100 after the underfill material 160 has been deposited between the second dies 120 and between the first die 110 and the bottom second die 120. The underfill material 160 is typically a flowable material that fills the interstitial spaces between the second dies 120, the electrically conductive elements 124, and the thermally conductive elements 128. The first portion 131 of the TTS 130 provides a dam member that inhibits the extent that the fillet 162 covers the peripheral region 112 of the first die 110. For example, instead of the fillet 162 spreading laterally over the peripheral region 112 as in other devices that attach a thermally conductive member to the peripheral region 112 after depositing the underfill material 160, the fillet 162 extends upwardly along a portion of the sidewall 146. The underfill material 160 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. The underfill material 160 can alternatively be a dielectric underfill, such as FP4585 manufactured by Henkel of Düsseldorf, Germany. In some embodiments, the underfill material 160 can be selected based on its thermal conductivity to enhance heat dissipation through the stack 122. The volume of underfill material 160 is selected to adequately fill the interstitial spaces such that an excess portion of the underfill material 160 goes into the gap (G) between the sidewall 146 of the first portion 131 and the stack 122 of second dies 120 to form the fillet 162. The height (H1), gap (G), and coverage area (C), are selected to provide a large coverage area (C) of the peripheral region 112 while also providing sufficient space between the sidewall 146 and the stack 122 of second dies 120 to accommodate the fillet 162 of underfill material 160.

Figure 2F:
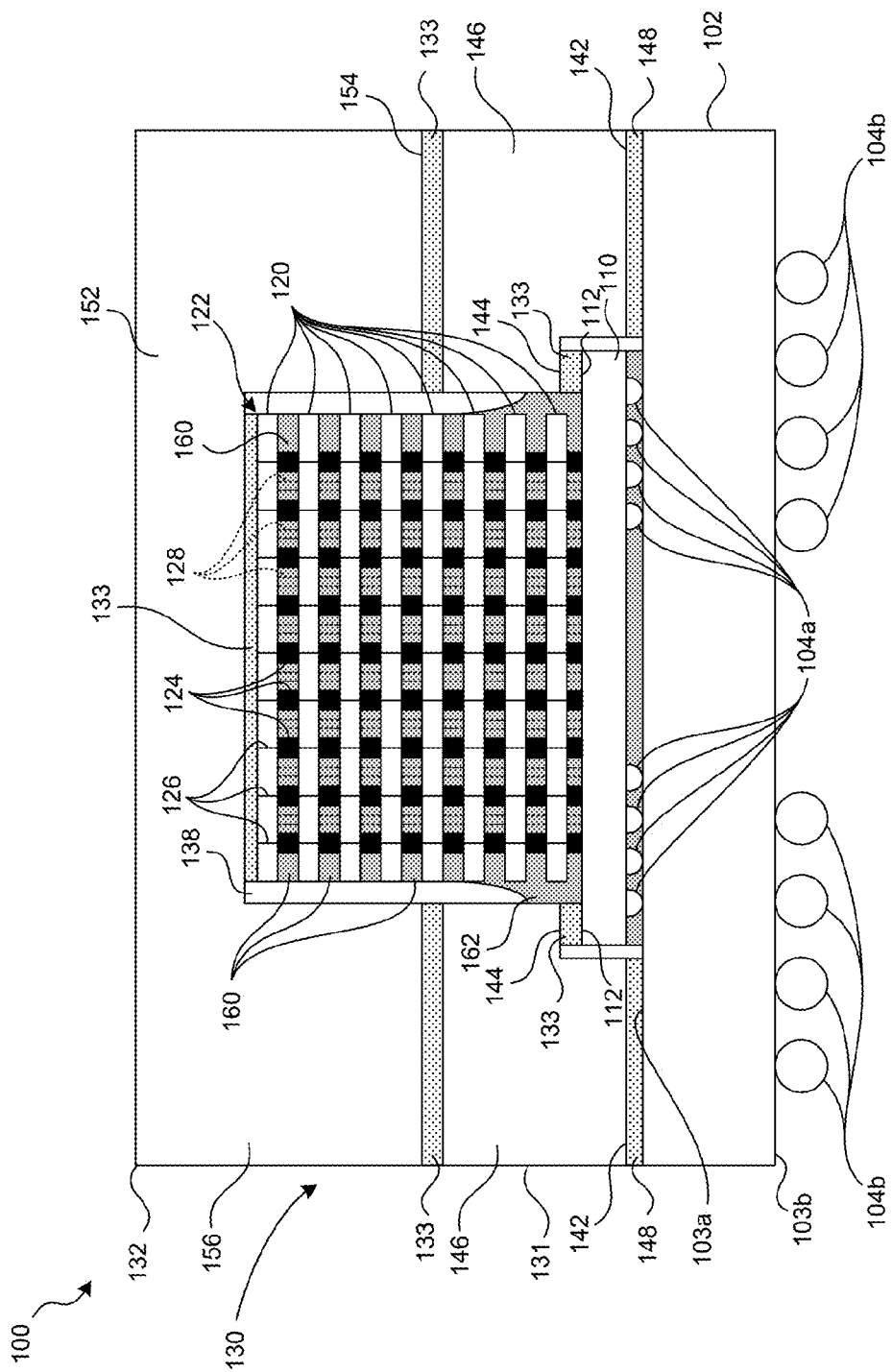

FIG. 2F is a cross-sectional view illustrating the assembly 100 of FIG. 1 after the second portion 132 of the TTS 130 has been attached to the first portion 131 to complete the TTS 130. The second portion 132 can have a top 152 attached to the uppermost second die 120 by the adhesive 133, a bottom 154 attached to the first portion 131 by the adhesive 133, and a sidewall 156 pendent from the top 152. The first portion 131 and second portion 132 together define the cavity 138 which encases the stack 122 of second dies 120. The TTS 130 of the embodiment illustrated in FIG. 2F is accordingly a thermally conductive casing that provides enhanced heat transfer to remove heat generated by the first die 110 and the second dies 120. Each of the first portion 131 and the second portion 132 of the TTS 130 can be made from metal, such as copper or aluminum, such that the TTS 130 has a metal base portion and a metal cover.

Figure 3:
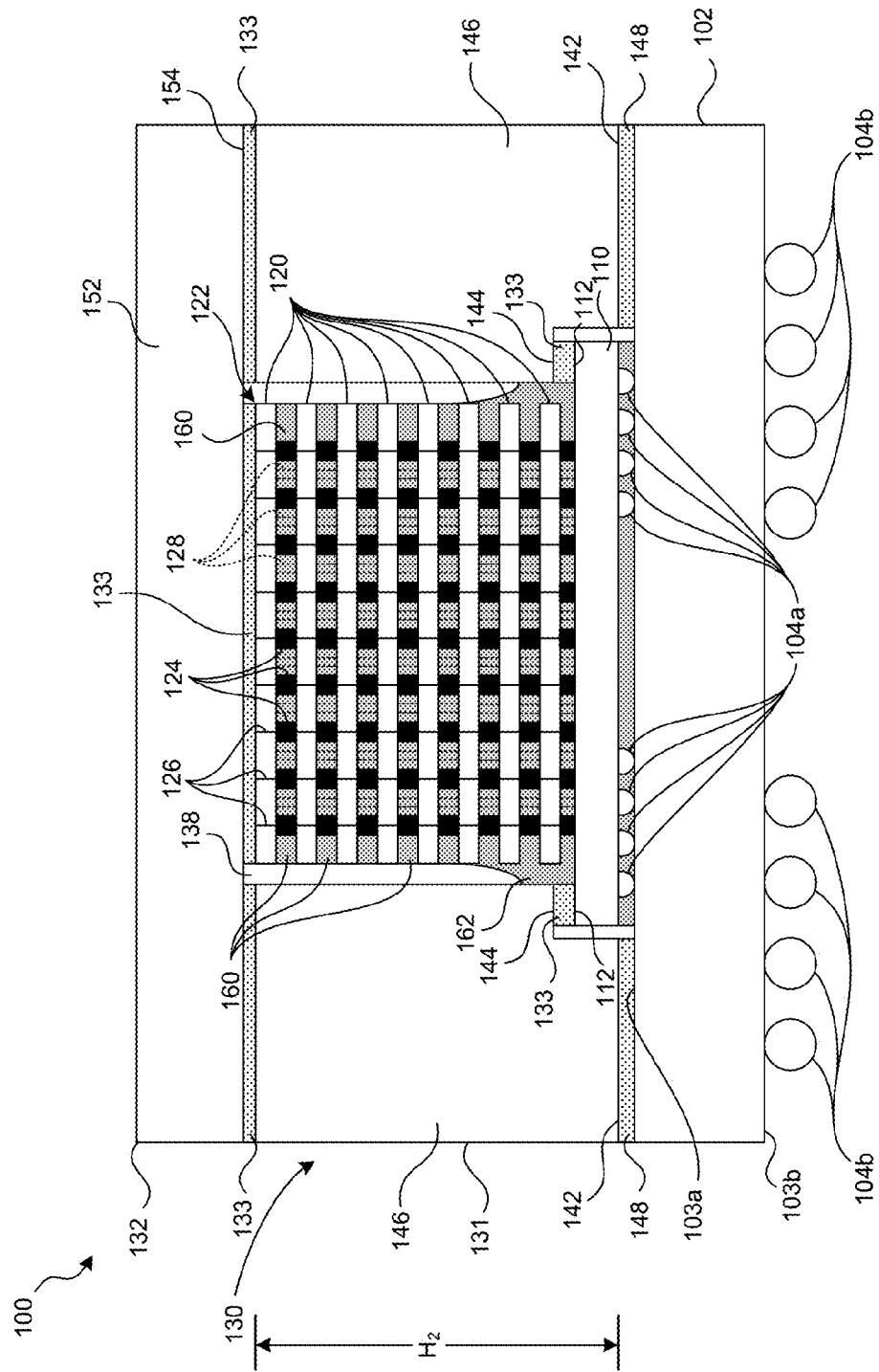
FIG. 3 is a cross-sectional view illustrating a semiconductor die assembly in accordance with embodiments of the present technology.

FIG. 3 is a cross-sectional view of another embodiment of the assembly 100 in accordance with the present technology. In this embodiment, the first portion 131 of the TTS 130 has a sidewall 146 with a height (H2) that extends to at least approximately the same elevation as the top of the uppermost second die 120, and the second portion 132 of the TTS 130 has a bottom 154 attached to the top of the sidewall 146. The second portion 132 accordingly does not have a separate sidewall pendent from the top 152. The second portion 132 can be attached to the first portion 131 by the adhesive 133.

Figure 4A:
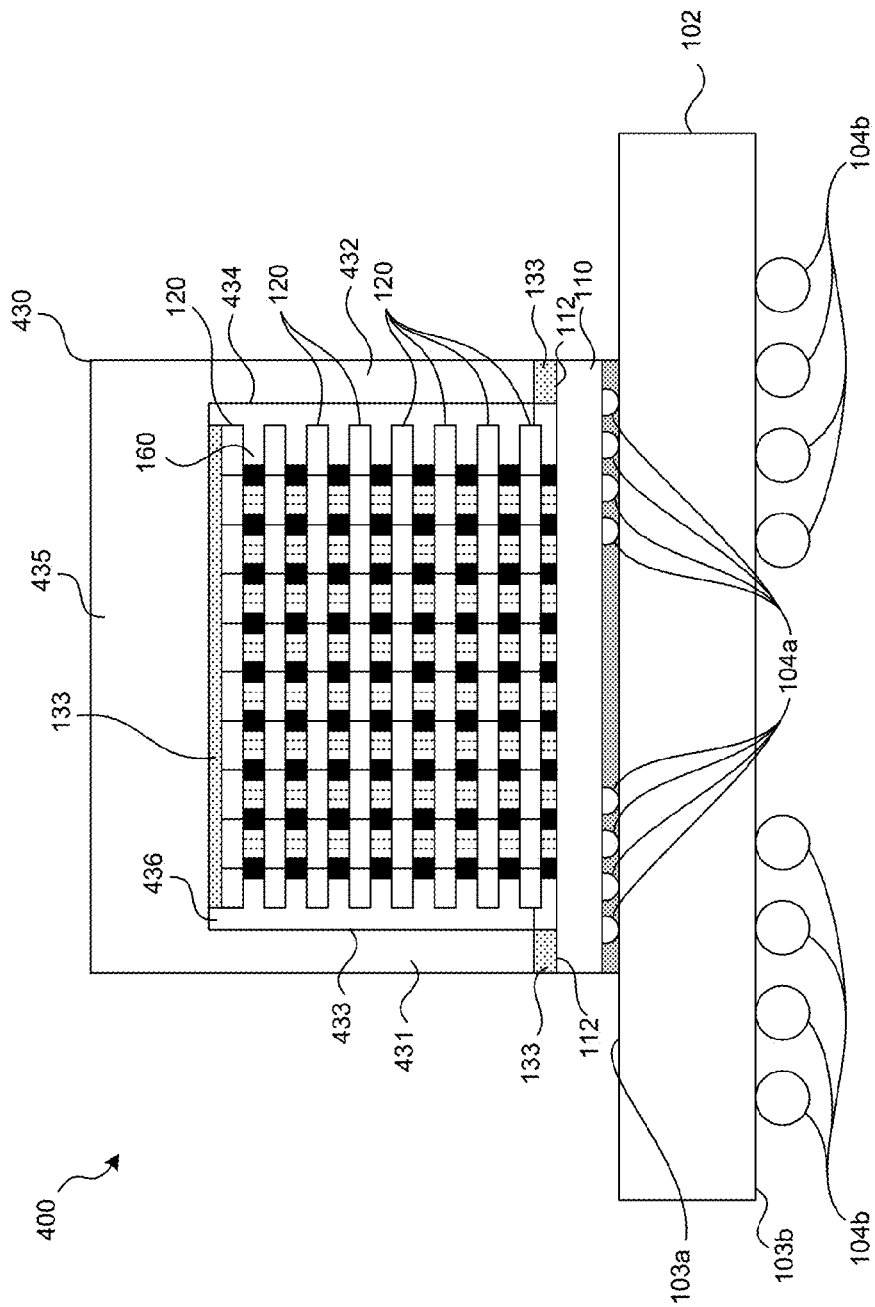
FIG. 4A is a cross-sectional view and FIG. 4B is a top plan view illustrating a method of manufacturing a semiconductor die assembly in accordance with embodiments of the technology.
Figure 4B:
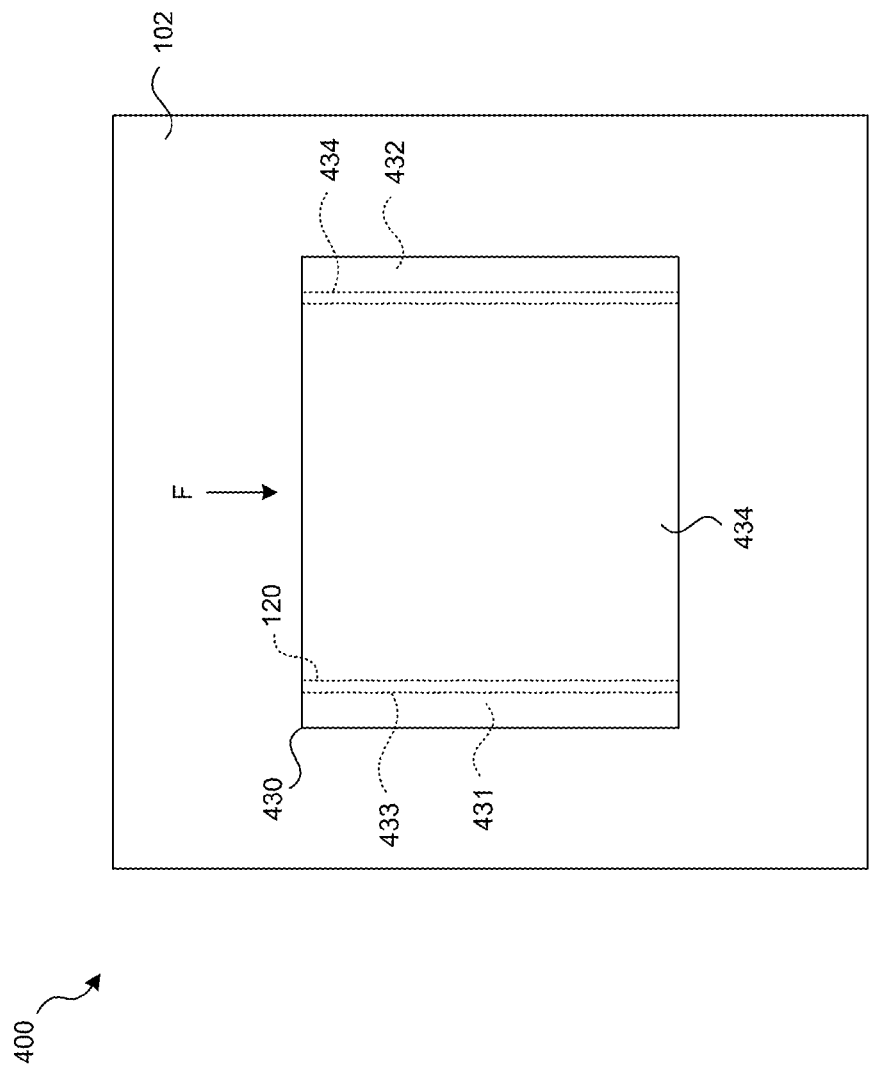

FIG. 4A is a side cross-sectional view and FIG. 4B is a top plan view of a semiconductor die assembly 400 at one stage of a manufacturing process in accordance with the present technology. Several features of the assembly 400 are similar to those described above with respect to the assembly 100, and thus like reference numbers refer to like components in FIGS. 1-4B. FIG. 4A shows the assembly 400 after an inner casing 430 has been attached to the first die 110. The inner casing 430 can include a first support 431 with a first interior surface 433, a second support 432 with a second interior surface 434, and a top 435 extending between the first and second supports 431 and 432. The inner casing 430 has a cavity 436 that is closed on the sides with the first and second supports 431 and 432, but open on the other two sides. The first and second supports 431 and 432 can be attached to the peripheral region 112 of the first die 110 with the adhesive 133. The top 435 of the inner casing 430 can also be attached to the top of the second die 120 by the adhesive 133. As shown in FIG. 4B, the inner casing 430 can have a footprint similar to the footprint of the first die 110.

Figure 4C:
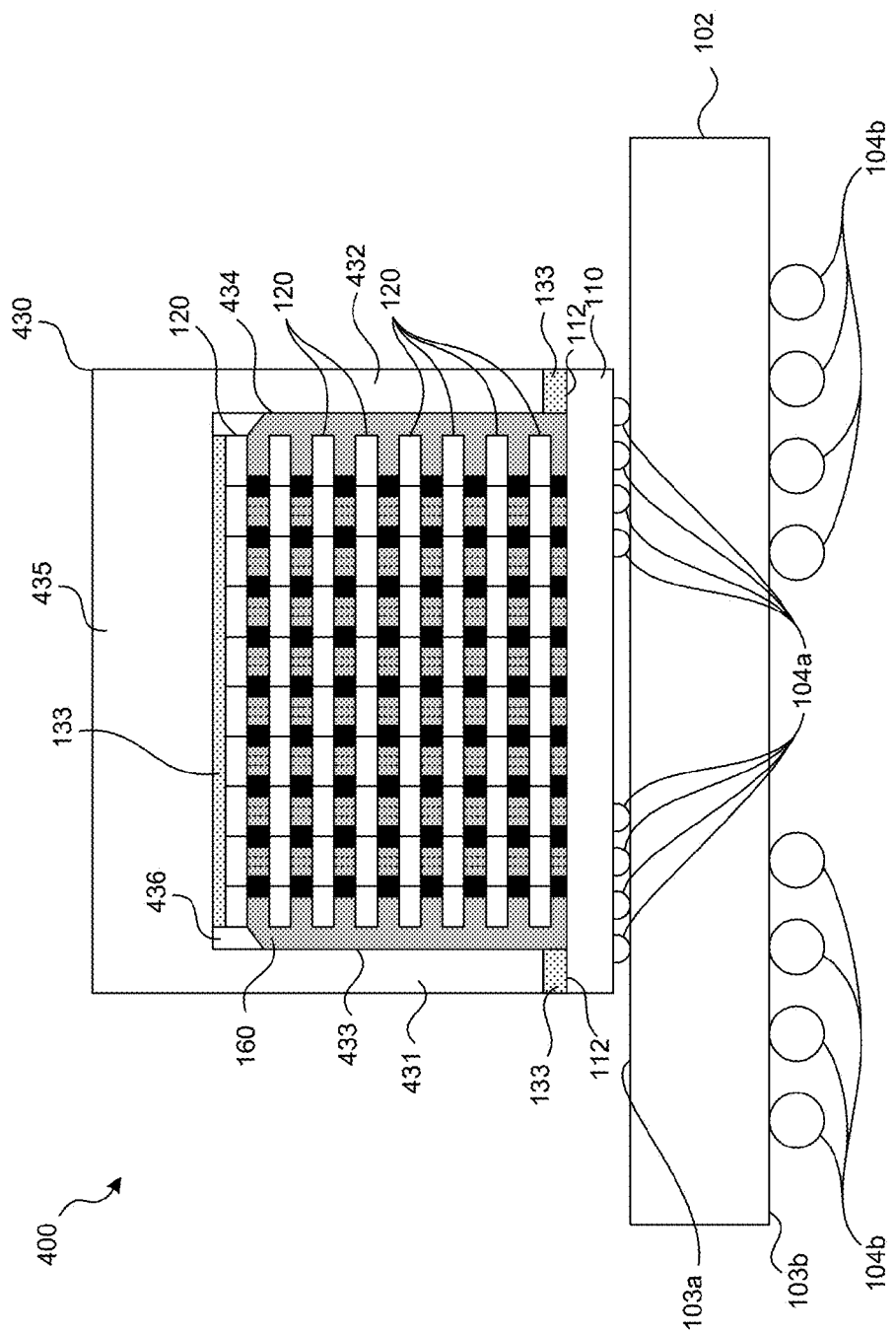
FIG. 4C is a cross-sectional view illustrating a method of manufacturing a semiconductor die assembly in accordance with embodiments of the present technology.

FIG. 4C is a side cross-sectional view of the assembly 400 at a subsequent stage of manufacturing after the underfill material 160 has been deposited between the second dies 120 and between the first die 110 and the bottom second die 120. Referring back to FIG. 4B, the underfill material can be distributed within the interstitial spaces by flowing the underfill material through the open sides of the inner casing 430 as shown by arrow F. To enhance the flow of underfill material, the assembly 400 can be inclined at an angle such that gravity pulls the underfill material 160 through the interstitial spaces within the cavity 436.

Figure 4D:
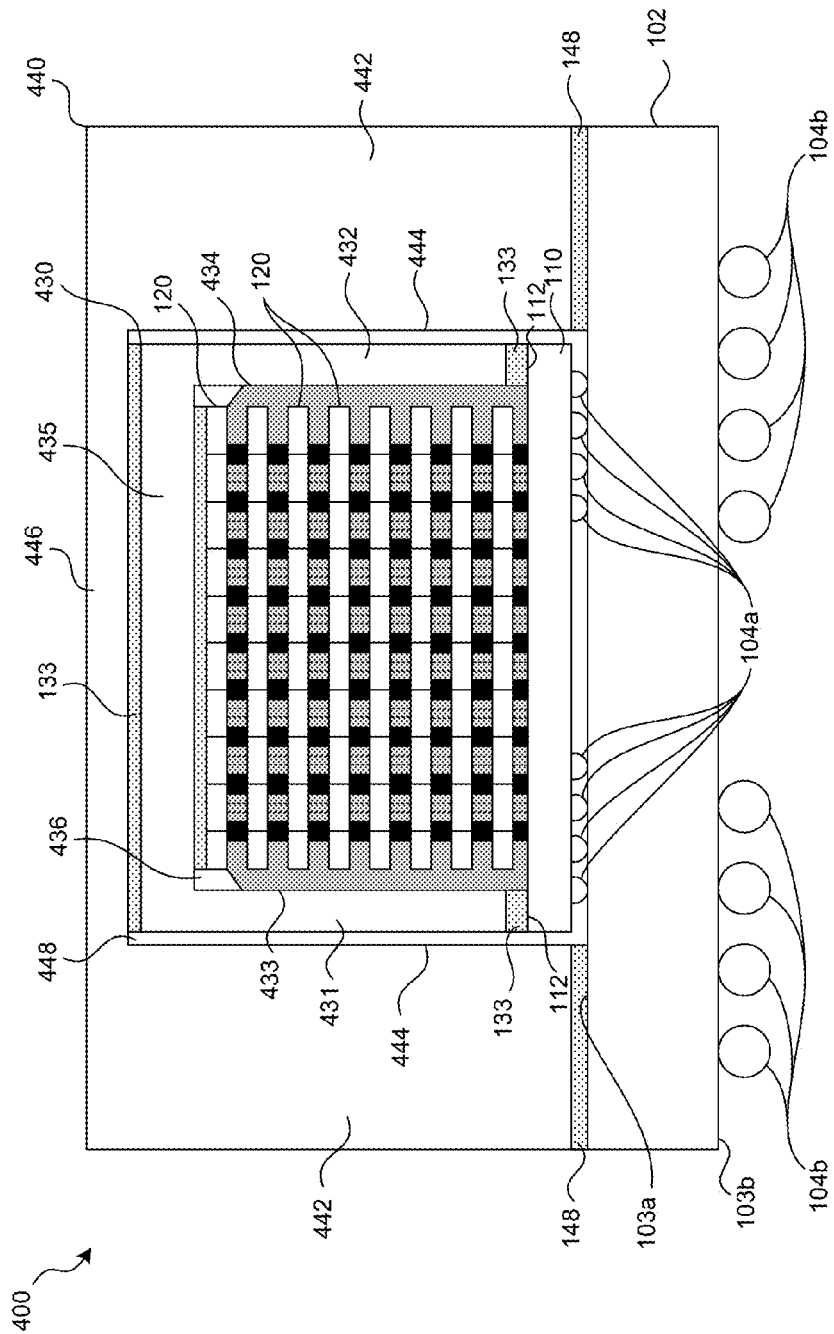
FIG. 4D is a cross-sectional view and FIG. 4E is a top plan view illustrating a method of manufacturing a semiconductor die assembly in accordance with embodiments of the present technology.
Figure 4E:
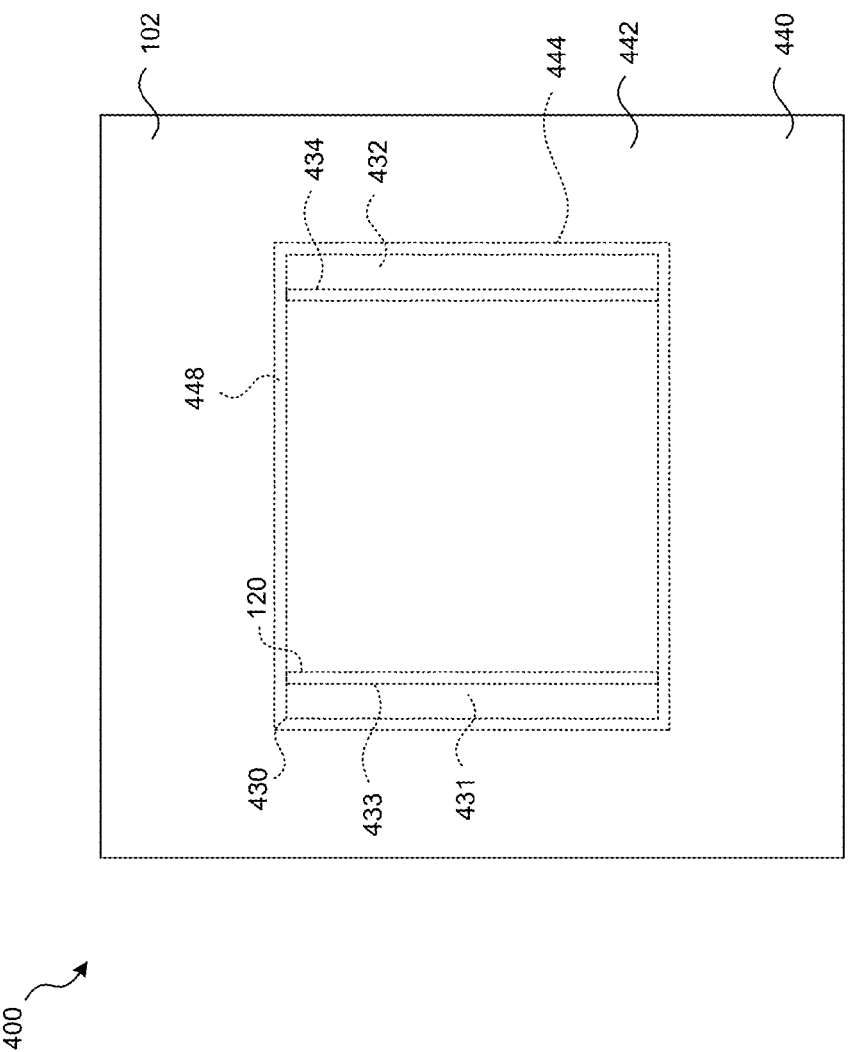

FIG. 4D is a side cross-sectional view and FIG. 4E is a top plan view of the assembly 400 at a subsequent stage of manufacturing. Referring to FIG. 4D, the assembly 400 further includes an outer casing 440 having a sidewall 442 with an inner surface 444 and a top 446 that together define a cavity 448. As shown in FIG. 4E, the inner surface 444 of the sidewall 442 has four sides such that the cavity 448 encloses the first die 110, the stack of second dies 120, and the inner casing 430. As shown in FIG. 4D, the outer casing 440 can be attached to the package support substrate 102 by the adhesive 148 and to the top 435 of the inner casing 430 by the adhesive 133. This embodiment provides a good thermal interface with the peripheral region 112 of the first die 110 as explained above and with the sides of the second dies 120 because the underfill material 160 can have a higher thermal conductivity than a void in within the casing.

Figure 5A:
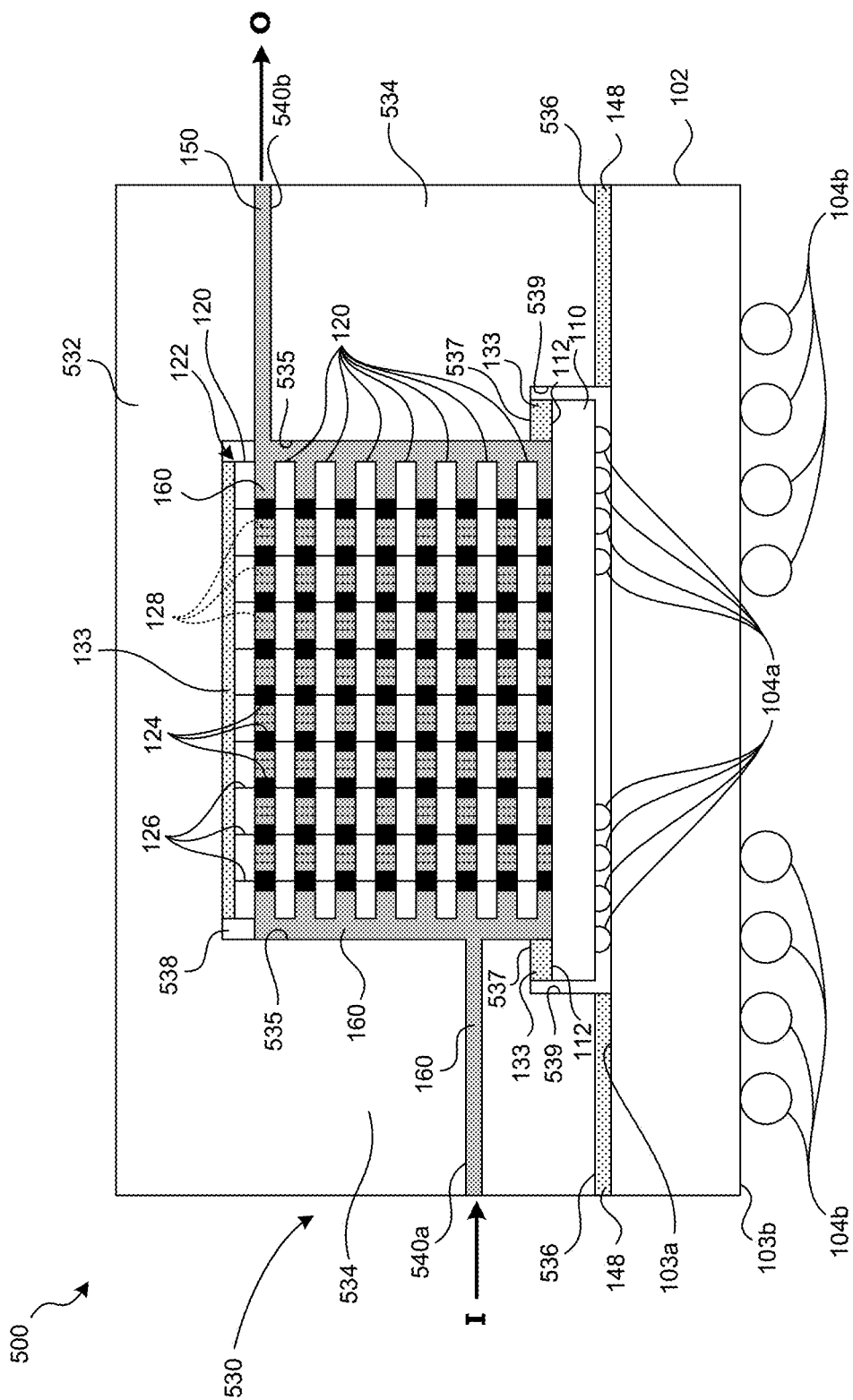
FIG. 5A is a cross-sectional view and FIG. 5B is a top plan view of a semiconductor die assembly in accordance with embodiments of the present technology.
Figure 5B:
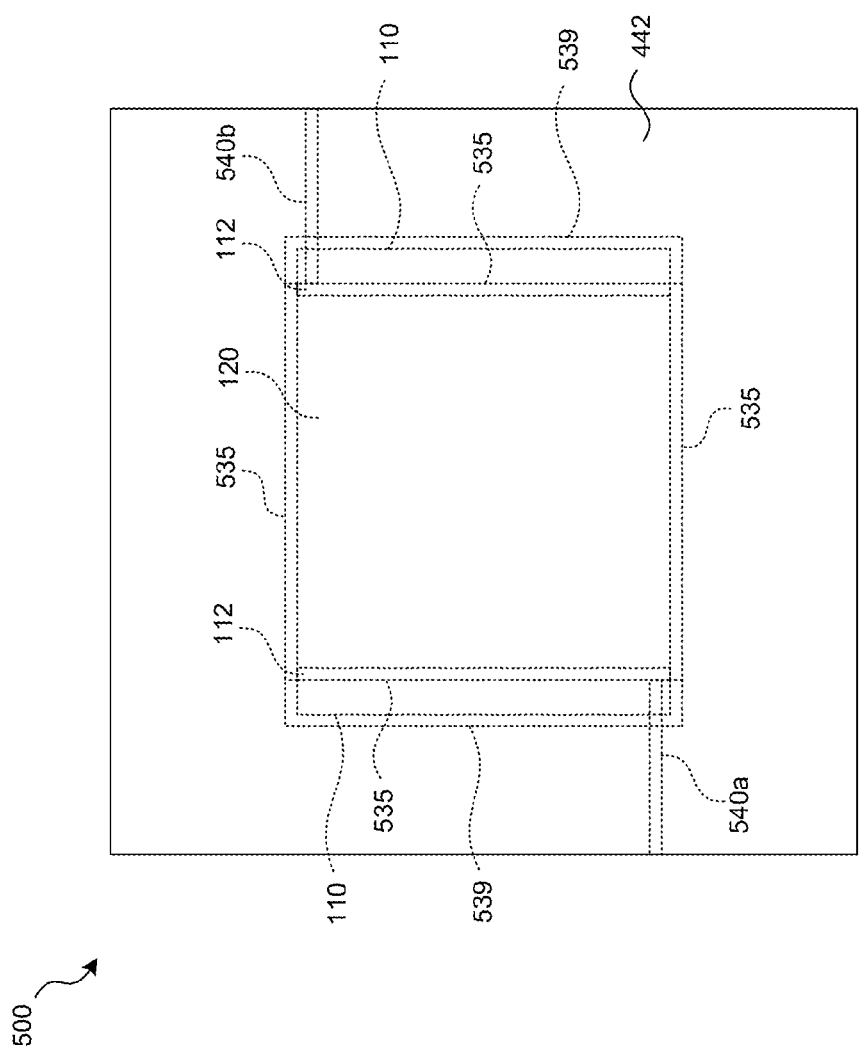

FIG. 5A is a cross-sectional view and FIG. 5B is a top plan view of a semiconductor device assembly 500 ("assembly 500") in accordance with another embodiment of the present technology. Like reference numbers refer to like components throughout FIGS. 1-5B. The assembly 500 includes a TTS 530 having a top 532, a sidewall 534 integrally formed with the top 532, and a cavity 538 defined by the top 532 and the sidewall 534. The TTS 530 is a single-piece casing formed from a material having a high thermal conductivity, such as copper or aluminum. The sidewall 534 can have an interior surface 535. In one embodiment as shown in FIG. 5B, the interior surface 535 can have four sides configured to be spaced apart from the stack 122 of second dies 120 such that a small gap exists between the second dies 120 and the interior surface 535 of the sidewall 534. Referring back to FIG. 5A, the sidewall 534 can further include a foundation 536 attached to the package support substrate 102 by the adhesive 148 and a shoulder 537 attached to the peripheral region 112 of the first die 110 by the adhesive 133. The foundation 536 can be a footing that has an inner surface 539 spaced laterally outward from the peripheral region 112 of the first die 110. The TTS 530 can further include an inlet 540a and an outlet 540b. The inlet 540a can be a first passageway extending through a lower portion of the sidewall 534, and the outlet 540b can be a second passageway that extends through an upper portion of the sidewall 534. Referring to FIG. 5B, the inlet 540a and the outlet 540b can be laterally offset from each other, or in other embodiments they can be aligned with each other across the cavity 538. In other embodiments, the inlet 540a and outlet 540b can extend through the sidewall at approximately the same elevation. In still other embodiments, the inlet 540a can be positioned relatively higher along the sidewall 534 than the outlet 540b.

The underfill material 160 is injected (I) into the cavity 538 via the inlet 540a such that the underfill material 160 fills the interstitial spaces between the second dies 120 and between the first die and the bottom second die 120. In one embodiment, the underfill material 160 can be injected into the cavity 538 until the underfill material 160 flows out of the outlet 540b (O). The inlet 540a and outlet 540b can be sealed by filling these passageways with the underfill material 160, or in other embodiments the exterior openings of the inlet 540a and outlet 540b can be capped with another material to seal the cavity 538 within the TTS 530. As a result, the TTS 530 provides a dam member that effectively contains the underfill material 160 while also providing coverage of a large surface area of the peripheral region 112 of the first die 110 by the shoulder 537 of the sidewall 534. Moreover, the underfill material 160 also contacts the sides of the second die 120 to also enhance the heat transfer laterally away from the second dies 120.

Figure 6:
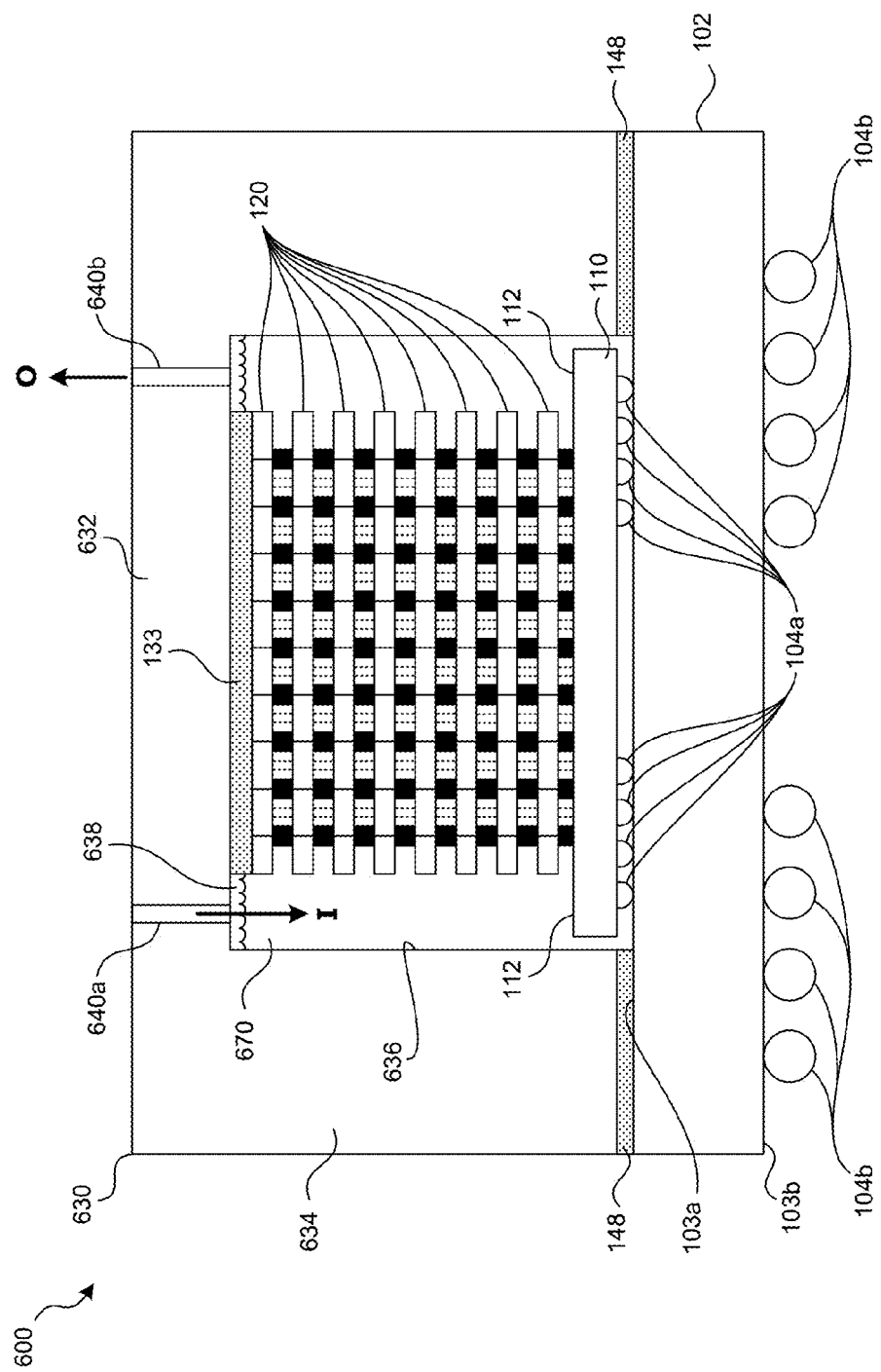
FIG. 6 is a cross-sectional view of a semiconductor die assembly in accordance with embodiments of the present technology.

FIG. 6 is a cross-sectional view of a semiconductor die assembly 600 ("assembly 600") in accordance with another embodiment of the present technology. Like reference number refer to like components in FIGS. 1-6. The assembly 600 can include a TTS 630 having a top 632 and a sidewall 634 having an interior surface 636. The top 632 and the sidewall 634 define a cavity 638 configured to receive the first die 110 and the stack 122 of second dies 120. The top 632 can be attached to the upper second die 120 by the adhesive 133, and the sidewall 634 can be attached to the package support substrate 102 by the adhesive 148. The embodiment of the sidewall 634 shown in FIG. 6 does not contact the peripheral region 112 of the first die 110. In other embodiments, the sidewall 634 can have a shoulder adhered to the peripheral region 112 of the first die 110 and a foundation adhered to the package support substrate 102 as shown by the shoulder 537 and foundation 536 of the sidewall 534 show in FIG. 5A. The TTS 630 can further include an inlet 640*a* and an outlet 640*b*. In the illustrated embodiment, the inlet 640*a* and outlet 640*b* are passageways that extend through the top 632 of the TTS 630. In other embodiments, the inlet 640*a* and/or the outlet 640*b* can be passageways through the sidewall 634. Additionally, the embodiment of the TTS 630 illustrated in FIG. 6 is a single-piece casing in which the top 632 is formed integrally with the sidewall 634. In other embodiments, the top 632 can be a separate component that is attached to the sidewall 634 by an adhesive, such as shown and described with respect to FIG. 3.

The assembly 600 further includes a thermally conductive dielectric liquid 670 in the cavity 638. The dielectric liquid 670 can be injected into the cavity 638 (I) via the inlet 640*a*. The outlet 640*b* can accordingly provide a vent through which air or other matter can escape (O) from the cavity 638 as the dielectric liquid 670 is injected. The dielectric liquid 670 can be injected as a liquid and remain in the liquid state within the cavity 638, or it can be injected as a liquid and partially cured to a gel-like substance or fully cured to a solid. Suitable thermally conductive dielectric liquids 670 include, for example, paraffin fluid and Dowtherm™ manufactured by the Dow Chemical Company. Suitable Dowtherm™ heat transfer fluids include Dowtherm A™, Dowtherm G™, Dowtherm Q™, Dowtherm SR-1™ and Dowtherm T™, all of which are manufactured by the Dow Chemical Company. In some embodiments, the dielectric liquid can have a thermal conductivity of 0.1-0.15 W/mK at 200° C., or in other embodiments it can include an additive, such as ethylene glycol, and a solution of 30% by volume of ethylene glycol in dielectric liquid can have a thermal conductivity of 0.5 W/mK. In some embodiments, the dielectric liquid 670 can further include carbon nanomaterials to increase the thermal conductivity. The dielectric liquid 670 should have a boiling point greater than the maximum operating temperature of the assembly 600 to avoid generating a gas in the cavity. In some embodiments, the dielectric liquid 670 can be selected to cure to a solid or semi-solid material at ambient temperatures, but undergo a phase change to a liquid state at or near maximum operating temperatures to potentially enhance the heat transfer and provide a steady state operating temperature when maximum operating temperatures are reached.

The dielectric liquid 670 can fill the interstitial spaces between the second dies 120 and between the first die 110 and the bottom second die 120 such that a separate underfill material is not necessarily required. In other embodiments, an underfill material may be deposited between the second dies 120 and between the first die 110 and the bottom second die 120 before filling the cavity 638 with the dielectric liquid 670. The underfill material is generally desirable when the dielectric liquid 670 remains in the liquid state to provide structural support for the dies 110, 120. However, the underfill material can be eliminated when the dielectric liquid 670 cures to a sufficiently solid state.

In operation, the dielectric liquid 670 contacts not only the peripheral region 112 of the first die 110, but also the second dies 120 to efficiently transfer heat to the TTS 630. This provides significantly more surface contact between a material with high thermal conductivity and the dies 110 and 120 compared to devices that use an underfill material and/or have voids between the casing and the dies 110 and 120. In some embodiments, the cavity 638 is completely filled to prevent voids within the TTS 630, and the inlet 640*a* and outlet 640*b* are capped to seal the cavity 638. The embodiment of the assembly 600 is expected to provide highly efficient heat transfer from the first and second dies 110 and 120.

Figure 7:
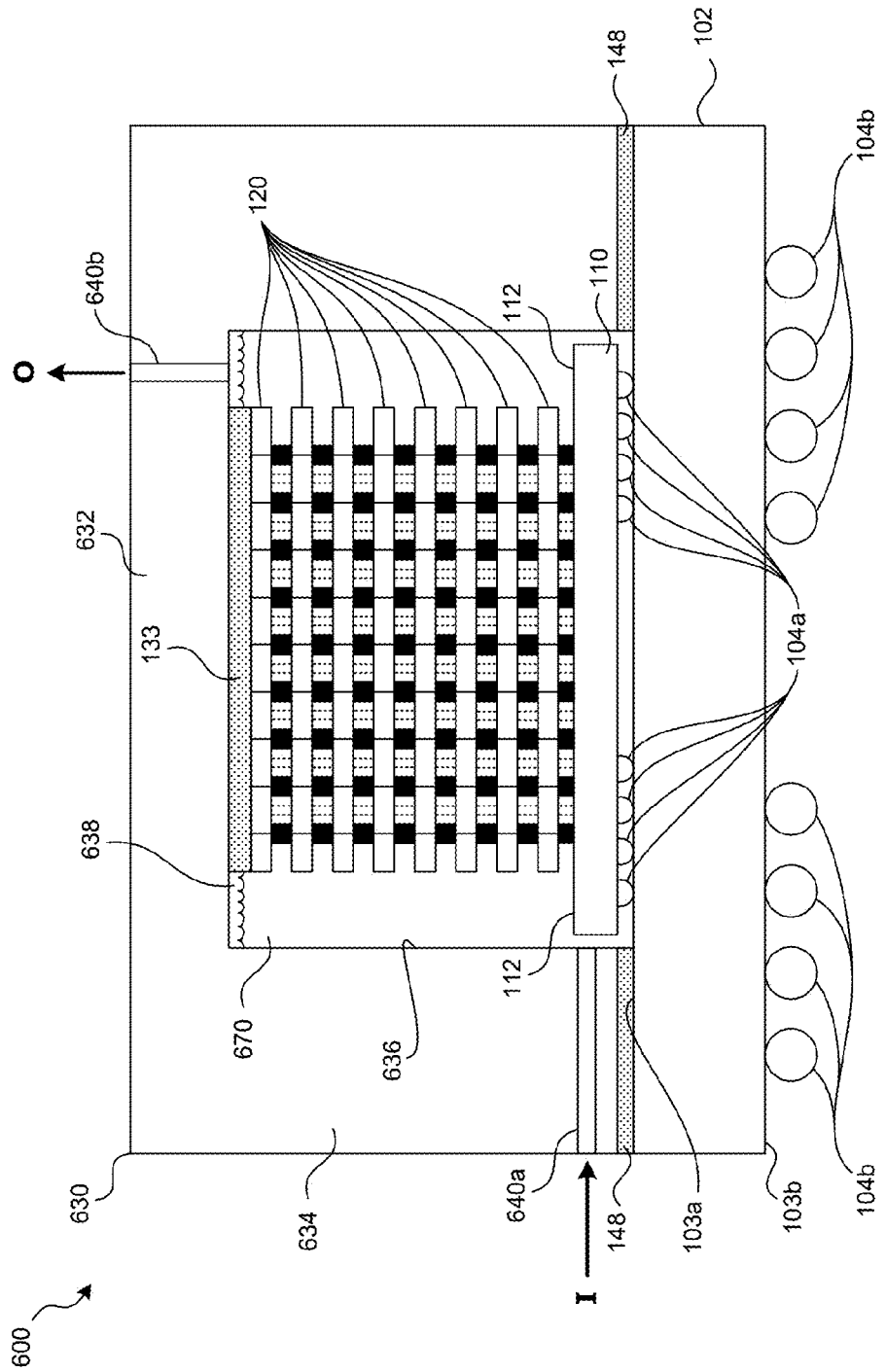
FIG. 7 is a cross-sectional view of a semiconductor die assembly in accordance with embodiments of the present technology.

FIG. 7 is a cross-sectional view of another embodiment of the assembly 600 in accordance with the present technology. In this embodiment, the inlet 640*a* is a passageway extending through a lower portion of the sidewall 634 and the outlet 640*b* is a passageway extending through the top 632. This embodiment provides bottom up filling of the cavity 638, which is expected to mitigate the possible formation of air pockets within the cavity 638.

Figure 8:
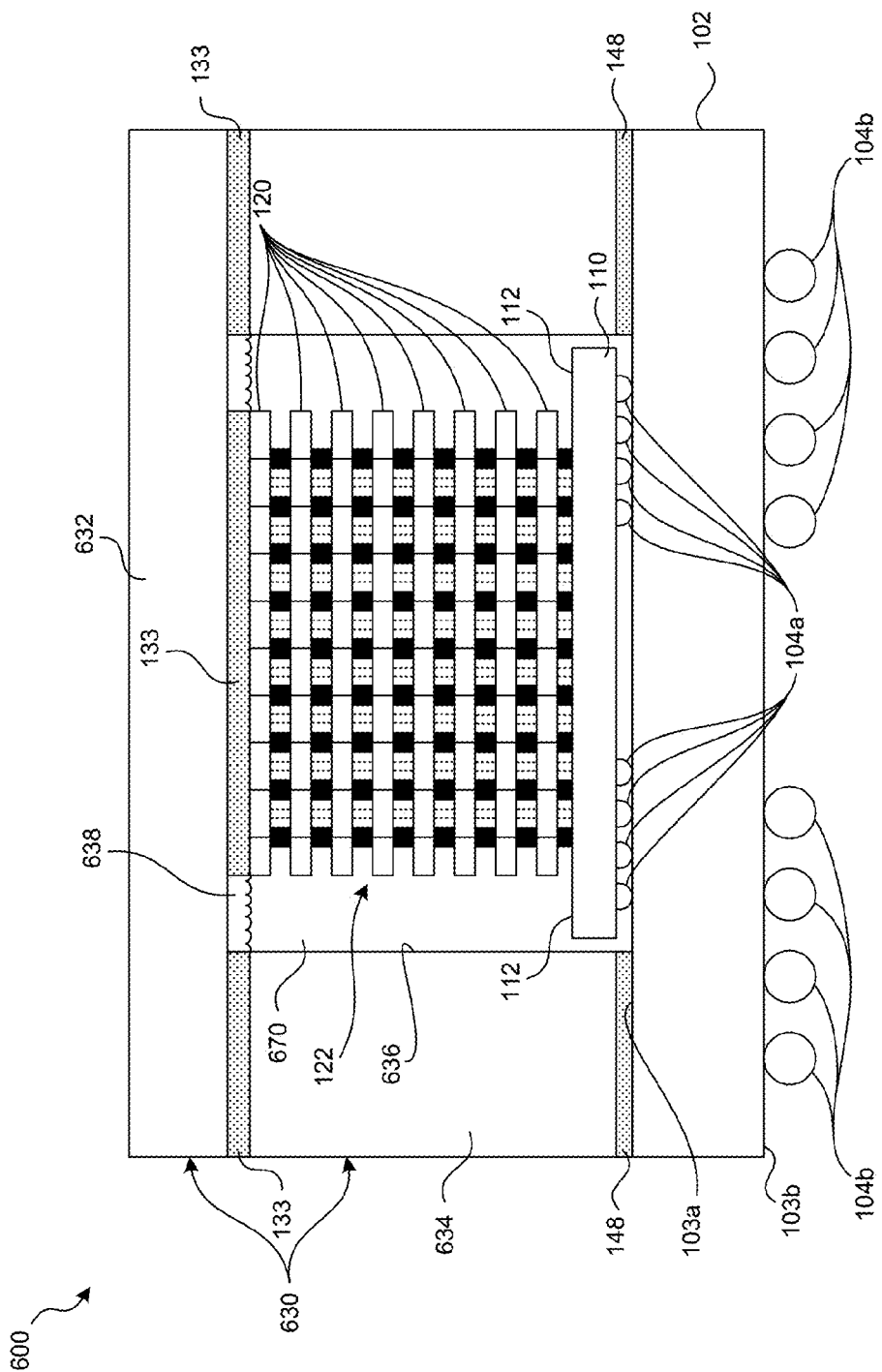
FIG. 8 is a cross-sectional view of a semiconductor die assembly in accordance with embodiments of the present technology.

FIG. 8 is a cross-sectional view illustrating another embodiment of the assembly 600 in accordance with the present technology. In this embodiment, the TTS 630 is a multi-piece casing having a top component 632 and a separate sidewall 634 that are attached to each other by the adhesive 133. The sidewall 634 can be attached to the package support substrate 102 by the adhesive 148, and then the space between the interior surface 636 of the sidewall 634 and the dies 110 and 120 can be filled with the dielectric liquid 670. The top 632 is then attached to the sidewall 634 and the upper second die 120 by the adhesive 133. In many embodiments, the cavity 638 will have a small void caused by the thickness of the adhesives 133. To avoid having an expandable gas within the cavity 638, the top 632 of the TTS 630 can be attached to the sidewall 634 in a vacuum.

Figure 9:
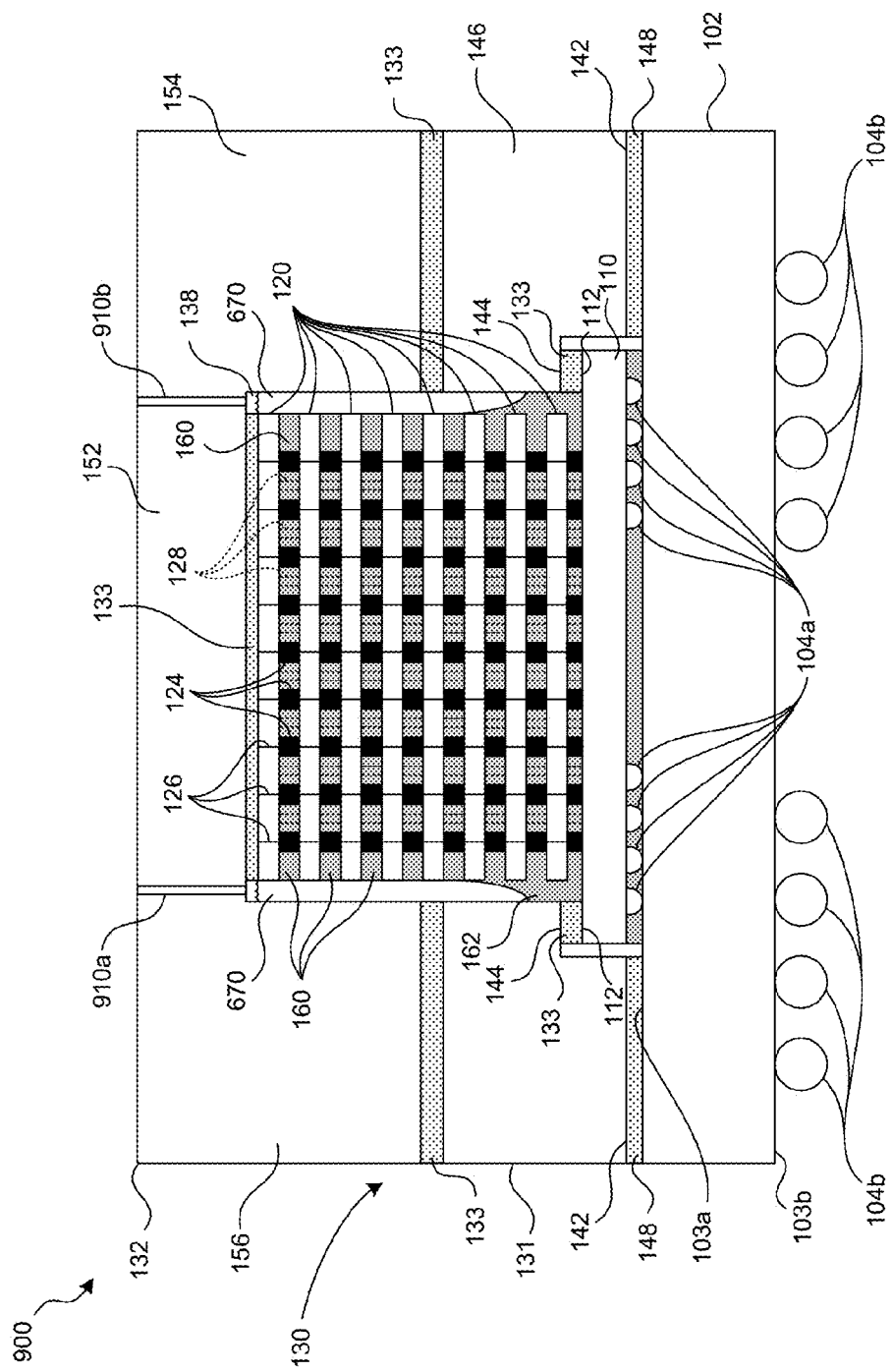
FIG. 9 is a cross-sectional view of a semiconductor die assembly in accordance with embodiments of the present technology.

FIG. 9 is a cross-sectional view of a semiconductor die assembly 900 ("assembly 900") in accordance with another embodiment of the present technology. The embodiment illustrated in FIG. 9 is similar to the embodiment of the assembly 100 illustrated in FIG. 2F, and therefore like reference numbers refer to like components in FIGS. 1-9. In the assembly 900, the TTS 130 can further include an inlet 910*a* and an outlet 910*b* in the second portion 132 of the TTS 130. The inlet 910*a* and outlet 910*b* are passageways that are exposed to the cavity 138 within the TTS 130. The assembly 900 further includes both the underfill material 160 and the dielectric liquid 670 in the cavity 138. The underfill material 160 can be deposited as described above with reference to FIG. 2E. The dielectric liquid 670 can be injected into the cavity via the inlet 910*a*, and air or excess dielectric liquid 670 can pass out of the cavity 138 via the outlet 910*b*. After the cavity 138 has been filled with the dielectric liquid 670, the inlet 910*a* and outlet 910*b* can be capped or otherwise sealed to seal the cavity 138 from the external environment.

Figure 10:
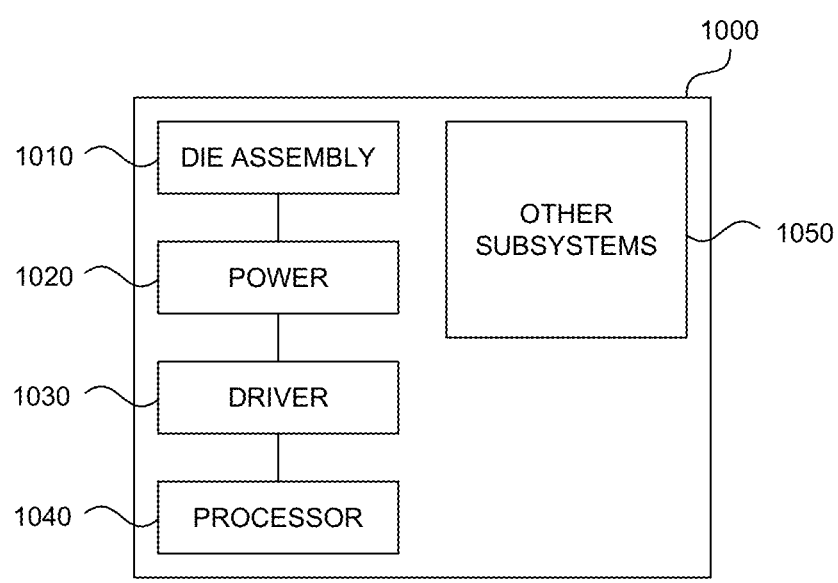
FIG. 10 is a schematic view of a system that includes a semiconductor die assembly configured in accordance with embodiments of the present technology.

Any one of the stacked semiconductor die assemblies described above with reference to FIGS. 1-9 can be incorporated into any of a myriad of larger and/or more complex systems, a representative example of which is system 1000 shown schematically in FIG. 10. The system 1000 can include a semiconductor die assembly 1010, a power source 1020, a driver 1030, a processor 1040, and/or other subsystems or components 1050. The semiconductor die assembly 1010 can include features generally similar to those of the stacked semiconductor die assemblies described above, and can therefore include multiple thermal paths with good coverage of the peripheral region 112 of the first die 110 that enhance heat dissipation. The resulting system 1000 can perform any of a wide variety of functions, such as memory storage, data processing, and/or other suitable functions. Accordingly, representative systems 1000 can include, without limitation, hand-held devices (e.g., mobile phones, tablets, digital readers, and digital audio players), computers, and appliances. Components of the system 1000 may be housed in a single unit or distributed over multiple, interconnected units (e.g., through a communications network). The components of the system 1000 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMCs, in other embodiments the semiconductor die assemblies can be configured as other memory devices or other types of stacked die assemblies. In addition, the semiconductor die assemblies illustrated in FIGS. 1-9 include a plurality of first semiconductor dies arranged in a stack on the second semiconductor die. In other embodiments, however, the semiconductor die assemblies can include one first semiconductor die stacked on one or more of the second semiconductor dies. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die assembly, comprising:
   a package support substrate;
   a first semiconductor die having a peripheral region and a stacking region;
   a second semiconductor die attached to the stacking region of the first die such that the peripheral region is lateral of the second die;
   a thermal transfer unit having a first portion attached to the peripheral region of the first die, a second portion attached to the first portion by an adhesive, and a cavity defined by the first and second portions, wherein the second die is within the cavity such that the second die is spaced apart from the first portion by a gap; and
   an underfill material in the cavity, wherein the underfill material has a fillet that fills at least a lower region of the gap between the first portion of the thermal transfer unit and the second die.

2. The semiconductor die assembly of claim 1 wherein the second die attached to the stacking region of the first die comprises a bottom second die, and the semiconductor die assembly further comprises a plurality of additional second dies stacked on the bottom second die, including an uppermost second die attached to the thermal transfer unit.

3. The semiconductor die assembly of claim 2 wherein:
   the first portion of the thermal transfer unit comprises an inner casing having a sidewall attached to the peripheral portion of the first die and a top attached to the uppermost second die; and
   the second portion of the thermal transfer unit comprises an outer casing encasing the inner casing, the first die, and the stack of second dies.

4. The semiconductor die assembly of claim 2 wherein the thermal transfer unit comprises a casing having a sidewall and a top, and the sidewall is attached to the peripheral portion of the first die and the top is attached to the uppermost second die by a thermal interface material.

5. The semiconductor die assembly of claim 4 wherein the sidewall has a foundation attached to the package support substrate and a shoulder attached to the peripheral region of the first die, and wherein the shoulder is attached to the peripheral region by a thermal interface material.

6. The semiconductor die assembly of claim 2 wherein the thermal transfer unit comprises a casing having sidewall and a top, the sidewall having four side panels and the top being a separate member attached to the four side panels.

7. The semiconductor assembly of claim 2 wherein the first portion of the thermal transfer unit comprises a ring surrounding the stack of second dies, and the second portion of the thermal transfer unit comprises a cover attached to the ring with a thermal interface material.

8. The semiconductor assembly of claim 2 wherein the first and second portions of the thermal transfer unit comprise a metal.

9. A semiconductor die assembly, comprising:
   a package support substrate;
   a first semiconductor die having a peripheral region and a stacking site;
   a plurality of second semiconductor dies arranged in a stack and mounted to the stacking site of the first die;
   a metal casing having first portion and a second portion, the first portion being attached to peripheral region of the first die and having an inner surface, the inner surface being spaced apart from the stack of second dies and extending upward, and the second portion enclosing the stack of second dies, wherein the first portion of the casing comprises a sidewall and a top attached to the sidewall, and the sidewall is attached to the peripheral region of the first die and the package support substrate, and wherein the top is attached to the sidewall by a thermal interface material and the top is attached to an uppermost second die of the plurality of second dies by a thermal interface material; and
   an underfill material between the stack of second dies and the first portion of the casing, wherein a portion of the underfill material engages the inner surface of the first portion.

10. The semiconductor die assembly of claim 9 wherein the sidewall has a height not less than an elevation of an uppermost second die of the plurality of second dies.

11. A semiconductor die assembly of, comprising:
   a package support substrate;
   a first semiconductor die having a peripheral region and a stacking site;
   a plurality of second semiconductor dies arranged in a stack and mounted to the stacking site of the first die;

a metal casing having first portion and a second portion, the first portion being attached to peripheral region of the first die and having an inner surface, the inner surface being spaced apart from the stack of second dies and extending upward, and the second portion enclosing the stack of second dies; and an underfill material between the stack of second dies and the first portion of the casing, wherein a portion of the underfill material engages the inner surface of the first portion, wherein the first portion of the casing comprises a ring having a foundation and a shoulder, the foundation being attached to the package support substrate, the shoulder being attached to the peripheral region by a thermal interface material, and the ring having a height below an uppermost second die of the plurality of second dies, wherein the second portion of the casing comprises a top attached to an uppermost second die of the plurality of second dies and a sidewall pendent from the top, and wherein the sidewall of the second portion is attached to the ring by a thermal interface material.

12. A semiconductor die assembly, comprising:

a package support substrate;

a first semiconductor die attached to the package support substrate, the first die having a peripheral region and a mounting region, and the first die generating a first heat;

a second semiconductor die attached to the mounting region of the first die, the second die generating a second heat less than the first heat;

a casing having a metal base attached to the peripheral region of the first die and a metal cover attached to the base, wherein the base has a height; and an underfill material on an area of the peripheral region of the first die between the second die and the base of the casing, wherein the underfill material extends upward along the height of the base.

13. The semiconductor device of claim 12 wherein the base comprises a ring and the cover comprises a top attached to the ring by a thermal interface material.

14. The semiconductor device of claim 13 wherein the cover further comprises a sidewall pendent from the top, and wherein the sidewall is attached to the ring.

15. The semiconductor device of claim 13 wherein the base comprises a sidewall extending to an elevation of an uppermost second die and the top is a flat panel connected to the sidewall.

16. A semiconductor die assembly comprising:

a package support substrate;

a first semiconductor die having a peripheral region and a stacking site;

a plurality of second semiconductor dies arranged in a stack and mounted to the stacking site of the first die;

a casing having first portion and a second portion, the first portion being attached to peripheral region of the first die, and the casing having a cavity enclosing the stack of second dies;

a thermally conductive dielectric material in the cavity, wherein the thermally conductive dielectric material contacts the casing and at least one of the second dies; and an underfill material between the second dies, wherein the thermally conductive dielectric material provides a thermal path between the casing and at least the first die, and wherein the thermally conductive dielectric material has a higher thermal conductivity than the underfill material.

17. The semiconductor die assembly of claim 16 wherein the thermally conductive dielectric material comprises a liquid.

18. The semiconductor die assembly of claim 16 wherein the thermally conductive dielectric material comprises a partially cured liquid.

19. The semiconductor die assembly of claim 16 wherein the thermally conductive dielectric material comprises a liquid that is instilled into the cavity and becomes a solid in situ within the cavity.

20. The semiconductor die assembly of claim 16 wherein the casing has an inlet configured to inject the thermally conductive material into the cavity and an outlet configured to exhaust matter from the cavity.

21. The semiconductor die assembly of claim 20 wherein the first portion of the casing comprises a sidewall and the second portion of the casing comprises a top integrally formed with the sidewall.

22. The semiconductor die assembly of claim 16 wherein the first portion of the casing comprise a sidewall having a height at least proximate an elevation of an uppermost second die, and the second portion of the casing comprises a top attached to the sidewall and the uppermost second die by an adhesive.

23. The semiconductor die assembly of claim 16 wherein the thermally conductive dielectric material comprises a paraffin.

24. The semiconductor die assembly of claim 16 wherein the second dies have a maximum operating temperature and the thermally conductive dielectric material has a phase transition temperature based on the maximum operating temperature at which the thermally conductive dielectric material forms a liquid.

25. The semiconductor die assembly of claim 16 wherein the thermally conductive dielectric material has a thermal conductivity of approximately 0.1 to 0.15 W/mK at 200° C.

26. The semiconductor die assembly of claim 16 wherein the thermally conductive dielectric material has a thermal conductivity of approximately 0.50 W/mK at 120° C. in a solution of ethylene glycol at 30% by volume.

* * * * *